US007261985B2

(12) United States Patent
Smith et al.

(10) Patent No.: US 7,261,985 B2
(45) Date of Patent: Aug. 28, 2007

(54) PROCESS FOR DETERMINATION OF OPTIMIZED EXPOSURE CONDITIONS FOR TRANSVERSE DISTORTION MAPPING

(75) Inventors: Adlai H. Smith, Escondido, CA (US); Joseph Bendik, Escondido, CA (US); Robert O. Hunter, Jr., San Diego, CA (US)

(73) Assignee: Litel Instruments, San Diego, CA (US)

( * ) Notice: Subject to any disclaimer, the term of this patent is extended or adjusted under 35 U.S.C. 154(b) by 708 days.

(21) Appl. No.: 10/800,110

(22) Filed: Mar. 12, 2004

(65) Prior Publication Data

US 2005/0202328 A1 Sep. 15, 2005

(51) Int. Cl.
*G03F 9/00* (2006.01)
*G03B 27/42* (2006.01)
*G03B 27/68* (2006.01)

(52) U.S. Cl. .................... 430/30; 430/22; 355/52; 355/53; 355/67; 355/77; 356/124; 356/401

(58) Field of Classification Search .................. 430/22, 430/30; 356/399, 400, 401, 124; 355/52, 355/53, 55, 67, 77
See application file for complete search history.

(56) References Cited

U.S. PATENT DOCUMENTS

| 5,285,236 | A | 2/1994 | Jain |
| 5,757,507 | A | 5/1998 | Ausschnitt et al. |
| 5,828,455 | A | 10/1998 | Smith et al. |
| 5,877,861 | A | 3/1999 | Ausschnitt et al. |
| 5,978,085 | A | 11/1999 | Smith et al. |
| 6,079,256 | A | 6/2000 | Bareket |
| 6,356,345 | B1 | 3/2002 | McArthur et al. |
| 6,573,986 | B2 | 6/2003 | Smith et al. |
| 6,975,382 | B2* | 12/2005 | Smith ........................... 355/52 |
| 7,099,011 | B2* | 8/2006 | McArthur et al. .......... 356/401 |
| 7,136,144 | B2* | 11/2006 | Smith et al. ................... 355/52 |

OTHER PUBLICATIONS

G. Muller, "The Waferstepper Challenge: Innovation and Reliability Despite Complexity", Version 1, pp. 1-11, Sep. 10, 2003.
"KLA 5105 Overlay Brochure", KLA-Tencor.
H.G. Müller et al., "Large Area Fine Line Patterning by Scanning Projection Lithography", MCM Proceedings, pp. 100-104, 1994.
J. van Schoot et al., "0.7 NA DUV Step & Scan System for 150nm Imaging with Improved Overlay", SPIE vol. 3679, pp. 448-456, 1999.
M.A. van den Brink et al., "Direct-Referencing Automatic Two-Points Reticle-To-Wafer Alignment Using a Projection Column Servo System", SPIE, Optical Microlithography V, vol.
A. Erdmann et al., "Influence of Optical Nonlinearities of Photoresists on the Photolithographic Process: Applications", SPIE, vol. 2726-29, 1996.
J.H. Bruning, "Optical Lithography—Thirty Years and Three Orders of Magnitude", SPIE, vol. 3051, pp. 14-27.
B.E. Newnam et al., "Development of XUV Projection Lithography at 60-80 nm", SPIE, vol. 1671, pp. 419-436, 1992.
J.E. Bjorkholm et al., "Reduction Imaging at 14 nm Using Multilayer-coated Optics: Printing of Features Smaller than 0.1 •m", J. Vac. Sci. Technol. B 8 (6), pp. 1509-1513, 19.
"Quaestor Q7 Brochure", Bio-Rad Semiconductor Systems.
D. MacMillen et al., "Analysis of Image Field Placement Deviations of a 5X Microlithographic Recuction Lens", SPIE vol. 334, pp. 78-89, 1982.
G.C. Robins et al., "Experimental Assessment of Pattern and Probe-Based Aberration Monitors", SPIE, Microlithography Proceedings, vol. 5040-149, pp. 1-12. 2003.
J. Sung, "Aberration Measurement of Photolithographic Lenses by Use of Hybrid Diffractive Photomasks", Applied Optics, vol. 42, No. 11, pp. 1987-1995, Apr. 10, 2003.
International Technology Roadmap for Semiconductors, 2001 Edition, SEMATECH, pp. 1-21.
F. Schellenberg, "Resolution Enhancement with OPC/PSM", Future Fab International, vol. 9, 2000.
I. Pollentier et al., "Thinking Outside the Box for Improved Overlay Metrology", SPIE Microlithography Proceedings, vol. 5038, pp. 12-16, 2003.
R. Martin et al., "Measuring Fab Overlay Programs", SPIE Metr. Inspection, and Process Control for Microlithography, XIII, pp. 64-71, Mar. 1999.
R. DeJule, "Mix-and-Match: A Necessary Choice", Semiconductor International, pp. 66-76, Feb. 2000.
J. Armitage, "Analysis of Overlay Distortion Patterns", J. Kirk, SPIE, vol. 921, pp. 207-221, 1988.
J. Wyant et al., "Basic Wavefront Aberration Theory for Optical Metrology", ISBN 0-12-408611-X, Chapter 1, pp. 1-53, 1992.
T. Brunner, "Impact of Lens Aberrations on Optical Lithography", IBM, vol. 41, pp. 1-2, 1997.
"TWINSCAN 1100 Product Literature"ASML.
C. Ausschnitt, "Distinguishing Dose from Defocus for In-Line Lithography Control", SPIE, vol. 3677, pp. 140-147, 1999.
L. Thompson et al., "Introduction to Microlithography", ACS, 2nd Edition, 1994, p. 69.
G. Moore, "Cramming More Components Onto Integrated Circuits", Electronics, vol.38, No. 8, 1965.

(Continued)

*Primary Examiner*—Christopher G. Young

(57) ABSTRACT

A process for providing illumination source conditions for the accurate determination Zernike tilt coefficients in the presence of coma is described. Large feature-shift coma sensitivity is simulated for a range of illumination conditions. The resulting source sensitivity data is modeled and a practical array of source shapes, each of which is optimized to eliminate the effects of transverse distortion due to third-order coma, is identified. The optimized set of source shapes can be used to more accurately determine Zernike terms a2 and a3 using a variety of methods. Knowledge of the lens distortion data in the absence of coma induced shifts can be entered into more traditional overlay regression routines to better identify systematic and random error. Additional applications of the above outlined procedure include: improved lithographic simulation using conventional optical modeling software and advanced process control in the form of feedback loops that automatically adjust the projection lens for optimum system performance.

53 Claims, 23 Drawing Sheets

OTHER PUBLICATIONS

P. Rai-Choudhury, "Handbook of Microlithography, Micromachining, and Microfabrication", SPIE Press, Microlithography, vol. 1, p. 417, 1997.

M.T. Takac et al., "Self-Calibration in Two-Dimensions: The Experiment", SPIE vol. 2725, pp. 130-146.

M.A. van den Brink et al., "Matching Management of Multiple Wafer Steppers Using a Stable Standard and a Matching Simulator", SPIE Integrated Circuit Metrology, Inspection, an.

M.R. Raugh, "Error Estimation for Lattice Methods of Stage Self-Calibration", SPIE vol. 3050, pp. 614-625.

T.F. Hasan et al., "Automated Electrical Measurements of Registration Errors in Step-and-Repeat Optical Lithography Systems", IEEE Transactions on Electron Devices, vol. ED-27.

C.A. Mack, "Inside PROLITH: A Comprehensive Guide to Optical Lithography Simulation", pp. 137-151.

M. Dusa et al., "Comprehensive Focus-Overlay-CD Correlation to Identify Photolithographic Performance", SPIE vol. 2726, pp. 545-554.

A.J. de Ruyter et al., "Examples of Illumination Source Effects on Imaging Performance", Arch Chemicals Microlithography Symposium, pp. 1-8, Sep. 22, 2003.

* cited by examiner

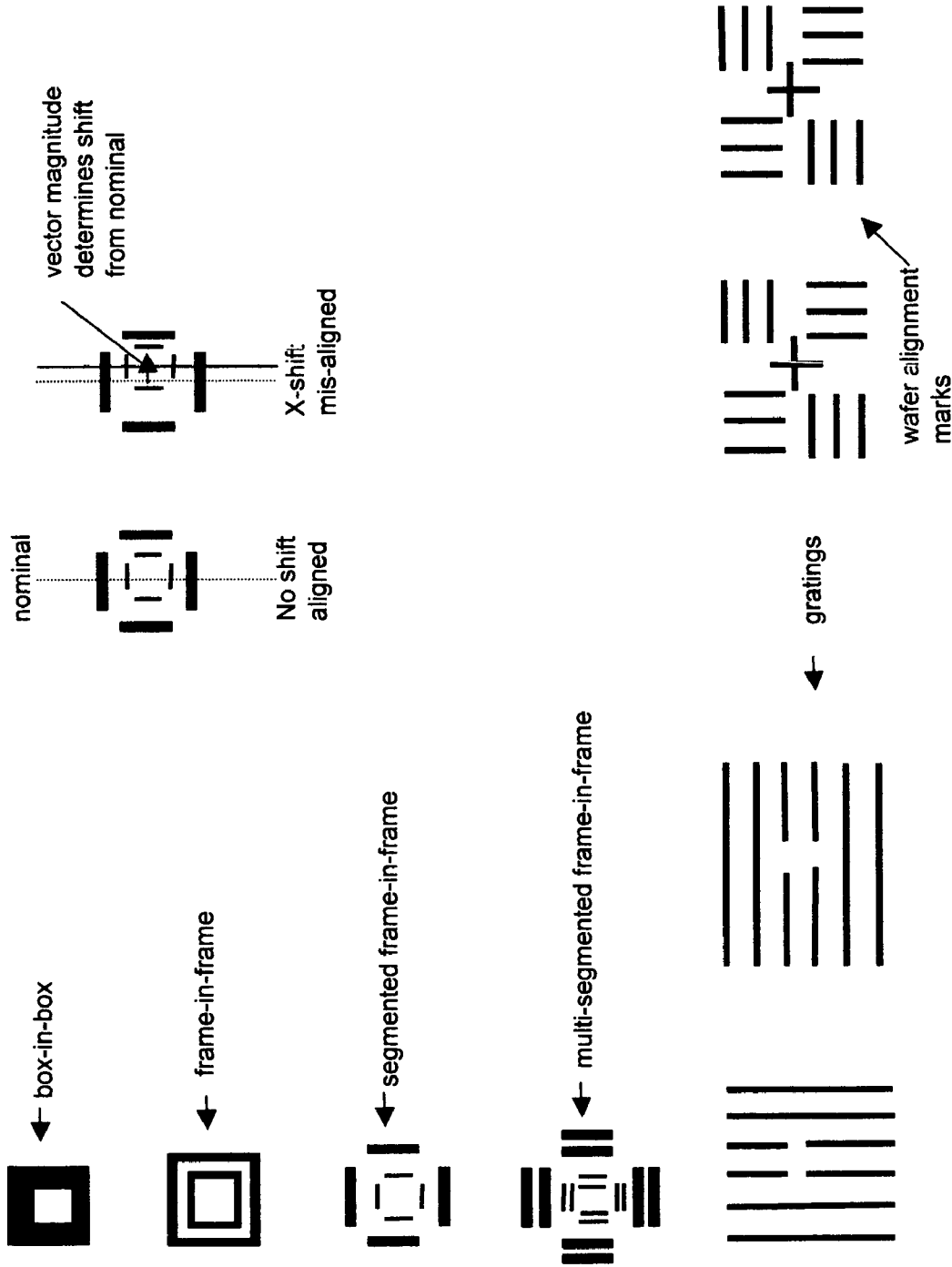

1um space/4um pitch
400nm resist Threshold model,
E/Eo = 3, focus =150nm

SOURCE SHAPES IN GENERALLY ACCESSIBLE OR 'PRACTICAL'
REGION. PRACTICAL REGION IS SIGMA_O < 0.8 AND 0.25 < EPS < 0.75

NA = 0.60, LAMBDA = 248NM

| SIGMA_O | 0.836 | 0.797 | 0.772 | 0.746 | 0.714 | 0.684 | 0.653 | 0.621 |
| --- | --- | --- | --- | --- | --- | --- | --- | --- |
| SIGMA_I | 0 | 0.239 | 0.309 | 0.373 | 0.428 | 0.479 | 0.522 | 0.559 |
| EPS | 0 | 0.3 | 0.4 | 0.5 | 0.6 | 0.7 | 0.8 | 0.9 |

EPS = fractional size of hole in source = SIGMA_I / SIGMA_O

Figure 6a

| Wavelength | NA exit | NA pole | NA center | Sigma Pole | Sigma Center |
|---|---|---|---|---|---|
| 365nm | 0.6 | 0.2 | 0.3270 | 0.3333 | 0.5450 |
| 248nm | 0.6 | 0.2 | 0.3263 | 0.3333 | 0.5438 |
| 193nm | 0.6 | 0.2 | 0.3232 | 0.3333 | 0.5387 |
| 157nm | 0.6 | 0.2 | 0.3189 | 0.3333 | 0.5315 |

Figure 6b

| Wavelength | NA exit | NA pole | NA center | Sigma Pole | Sigma Center |
|---|---|---|---|---|---|
| 365nm | 0.9 | 0.2 | 0.4995 | 0.2222 | 0.5550 |
| 248nm | 0.9 | 0.2 | 0.4818 | 0.2222 | 0.5353 |
| 193nm | 0.9 | 0.2 | 0.4725 | 0.2222 | 0.5250 |
| 157nm | 0.9 | 0.2 | 0.4719 | 0.2222 | 0.5243 |

| FITTING COEFFICIENTS AS FUNCTION OF LAMBDA/NA | | | | | |
|---|---|---|---|---|---|
| LAMBDA/NA [UM] | LAMBDA | NA | SO | dSO/dSI^2 | RSQ |
| 0.73 | 365 | 0.5 | 0.8652 | -0.9867 | 0.9969 |
| 0.413966667 | 248.38 | 0.6 | 0.8375 | -0.6808 | 0.9989 |
| 0.331173333 | 248.38 | 0.75 | 0.8233 | -0.706 | 0.9992 |
| 0.257333333 | 193 | 0.75 | 0.819 | -0.833 | 0.9974 |
| 0.174444444 | 157 | 0.9 | 0.7813 | -0.7539 | 0.9966 |

PROCESS FOR DETERMINATION OF OPTIMIZED EXPOSURE CONDITIONS FOR TRANSVERSE DISTORTION MAPPING

BACKGROUND OF THE INVENTION

1. Field of the Invention

The present invention relates generally to optical metrology and more particularly to methods for the determination of intra-field distortion and lens aberrations for projection imaging systems used in semiconductor manufacturing.

2. Description of the Related Art

Semiconductor manufacturers and lithography tool vendors have been forced to produce higher numerical aperture (NA) lithography systems (steppers or scanners) using smaller wavelengths (for example, 193 nm DUV lithography) in response to the semiconductor industry's requirement to produce ever-smaller critical features. See, for example, the statement of the well-known "Moore's Law" at "Cramming More Components Onto Integrated Circuits", G. Moore, *Electronics*, Vol. 38, No. 8, 1965. The ability to produce (manufacture) sub-wavelength features can often be determined by considering the rather simple (3-beam) Rayleigh scaling Resolution (R) and Depth-of-Focus (DoF) equations: $\sim \lambda/2NA$ and $\sim \lambda/2NA^2$. See "Introduction to Microlithography", L. Thompson et al., *ACS*, 2nd Edition, 1994, p. 69. These coupled equations stress the inverse relationship between resolution and DoF based on the exposure wavelength ($\lambda$ and numerical aperture (NA), for features printed near the limit of the optical system. High NA lithography (including immersion lithography) has led to improved resolution and a reduction in the overall focus budget, making lithography processes difficult to control. See "Distinguishing Dose from Defocus for In-line Lithography Control", C. Ausschnitt, *SPIE*, Vol. 3677, pp. 140:147, 1999, and "TWINSCAN 1100 Product Literature" *ASML*. In addition, the push for faster product development, reduced cycle time, and better cost management often means that photolithographic exposure tools (steppers and scanners) are pushed beyond performance specifications, where lens aberrations and exposure source variations become critical to monitor and understand. See "Impact of Lens Aberrations on Optical Lithography", T. Brunner, *IBM*, Vol. 41, pp. 1:2, 1997 (available at the URL of www.research.ibm.com). Aberrations (wave front deviation), defined as the deviation of the real performance of a projection lens from ideal performance, can be mathematically formulated a number of ways, but in each case the result is a mathematical description of the phase error across the lens pupil. See, for example, "Basic Wavefront Aberration Theory for Optical Metrology", J. Wyant, K. Creath, *ISBN* 0-12-408611-X, Chapter 1, pp. 1-53, 1992. Lens aberrations are typically responsible for both local (field dependent) transverse error (feature-shift) and critical dimension variation (feature shape error). The present discussion will be concerned with aberrations responsible for transverse error, stemming from both source and lens. We use a rather general Zernike aberration convention, where $A_{0,\,0,\,1}$ and $A_{0,\,0,\,-1}$ (or a2 and a3) are the Zernike x-tilt, y-tilt coefficients, where $A_{0,\,3,\,-1}$ and $A_{0,\,3,\,1}$ (or a8 and a7) are the Zernike coma-x, coma-y coefficients, and where O(ax) represents higher order aberrations, each of which is responsible for some portion of transverse distortion and possibly other effects. Several methods exist for determining transverse distortion as function of field position using overlay metrology. See "Analysis of Overlay Distortion Patterns", J. Armitage, J. Kirk, *SPIE*, Vol. 921, pp. 207:221, 1988, "Method and Apparatus for Self-Referenced Projection Lens Distortion Mapping, A. Smith et al., U.S. Pat. No. 6,573,986 issued Jun. 3, 2003, and "Method and Apparatus for Self-Referenced Dynamic Step and Scan Intra-Field Lens Distortion", A. Smith, U.S. patent application Ser. No. 10/252,020 filed Sep. 20, 2002. However, the ability to precisely determine the Zernike coefficients (a2 and a3) depends on the ability to separate out the distortion effects of (low order) coma since both aberrations give rise to feature-shift. The third-order coma (x-coma, y-coma or both), or the effects from third-order coma, can occur when image contributions from different pupil radii shift relative to one another, as described by Equation 1 below, a generalized Zernike polynomial (of the third-order) for the optical path difference (OPD):

$$OPD(Z7, Z8) = \text{factor}^*(3\rho^3 - 2\rho^*\sin(\phi), \cos(\phi) \text{ or factor}^*(3\rho^2 - 2)^*Z2, Z3 \quad \text{(Eq. 1)}$$

where Z8, Z7 represent the Zernike polynomials for x-coma and y-coma, $\rho$ is the exit pupil radius, $\phi$ is the angular position in the pupil, and Z2, Z3 represent the Zernike polynomials for x and y field tilt. See "Impact of Lens Aberrations on Optical Lithography", supra, for discussion of Zernike polynomials.

Equation 1 shows clearly that rays (for geometric descriptions) passing near the center of the pupil deviate differently than rays near the edge of the pupil. These ray deviations cause both CD variation (asymmetric feature patterns) and feature-shift. The variation in phase across the exit pupil in the presence of x-coma, for example, is shown in FIG. 1a. Since most photolithographic exposure tools allow for different source shapes, the feature dependent shift is also a function of source shape and varies slowly across the exposure field or scanning slot. In the presence of coma, a small pin hole (opening<<transverse resolution) on a reticle is imaged into a comet-type object, as shown in FIG. 1b. Finally, since lithographic features are created by the complex superposition of many small aberrated point sources, the resulting feature shapes generally depend on both the size and orientation of the reticle patterns.

Detailed and accurate knowledge of the aberrations (especially those related to transverse distortion) can be fed directly into (inter and intra-field) overlay modeling and control routines to improve overlay performance, since the overlay control models (for example, models such as Klass II and Monolith) require understanding of all sources of distortion or transverse displacement. See "Analysis of Overlay Distortion Patterns", supra, and "Mix-and-Match: A Necessary Choice", R. DeJule, *Semiconductor International*, pp. 66:76, February 2000. Overlay registration, or misregistration, is the translational (positional) error that exists between features exposed layer to layer in the vertical fabrication process of semiconductor devices on silicon wafers. Typically, alignment attributes or overlay targets are used to determine the magnitude of the error (see FIGS. 2a-2b). Other names for overlay registration include registration error and pattern placement error; for this description, the terms "overlay error" or "error" will be used. An overview of overlay modeling and control schemes can be found in "Analysis of Overlay Distortion Patterns", supra, "Measuring Fab Overlay Programs", R. Martin et al., *SPIE Metr. Inspection, and Process Control for Microlithography*, XIII, pp. 64:71, March 1999, and "Method for Overlay Control System", C. Ausschnitt et al., U.S. Pat. No. 5,877, 861 issued Mar. 2, 1999. Finally, in addition to lateral shifts, distortion related aberrations are also responsible for degrading image fidelity (or modulation), proportional to the variance of the distortion along the scanning direction. Given details of the lens distortion, those of skill in the art can generally make changes in the configuration of the slit geometry and improve imaging performance.

There are various sources of overlay error for both targets and patterned features. See, for example, "The Waferstepper Challenge: Innovation and Reliability Despite Complexity", Gerrit Muller, *Embedded Systems Institute Netherlands*, pp. 1-10, 2003. These overlay error sources include reticle (tilt, pattern misplacement, warp), source (telecentricity, source settings), overlay mark fidelity, feature dependent processing error, wafer (topography, flatness), lens (aberrations, telecentricity), stage (static and dynamic stage error global alignment), overlay measurement (tool induced shift, precision), and tool matching (stage, lens, matching accuracy). See, for example, "Thinking Outside the Box for Improved Overlay Metrology", I. Pollentier et al., *SPIE Microlithography Proceedings*, Vol. 5038, pp. 12:16, 2003, and "Method and Apparatus for Self-Referenced Dynamic Step and Scan Intra-Field Scanning Distortion", A. Smith, U.S. patent application Ser. No. 10/252,021 filed Sep. 20, 2002. It is interesting to note that the overlay error associated with large feature alignment attributes only approximates the overlay error associated with the actual printed circuit features since features for a variety of reasons including: size differences, pattern placement error, inherent overlay mark error, source/aberration coupling.

Over the past 30 years the microelectronics industry has experienced dramatic rapid decreases in critical dimension (feature-size) by constantly improving photolithographic imaging systems and developing new reticle enhancement techniques. See, for example, "Resolution Enhancement with OPC/PSM", F. Schellenberg, *Future Fab International*, Vol. 9, 2000. Photolithographic imaging systems are often pushed to and beyond performance limits. As the critical dimensions of semiconductor devices approach 50 nm (and below), the overlay error requirements will soon approach atomic dimensions, making overlay process control extremely difficult. See "International Technology Roadmap for Semiconductors, 2001 Edition", *SEMATECH*, pp. 1-21. New methods for identifying and quantifying the sources of overlay error will become vital. In particular, methods for accurately determining lens aberrations (especially low order distortion) and source irregularity and their coupled effects on image fidelity and overlay will remain critical. Finally, another area where quantifying distortion error is of vital concern is in the production of photomasks (and direct-write lithography) during the electron beam (including; laser, multi-mirror, ion-beam) manufacturing processes. See "Handbook of Microlithography, Micromachining, and Microfabrication", P. Rai-Choudhury, *SPIE Press*, Microlithography, Vol. 1, pp. 417, 1997.

Aberration and Source

Some examples of typical illumination source or illumination geometry for photolithographic imaging systems are illustrated in FIG. 3. Several good references on aberrations and their effects on lithographic imaging can be found in the literature. See, for example, "Aberration Measurement of Photolithographic Lenses by Use of Hybrid Diffractive Photomasks", J. Sung et al., *Applied Optics*, Vol. 42, No. 11, pp. 1987-1995, Apr. 10, 2003, and "Impact of Lens Aberrations on Optical Lithography", supra. The effects of third-order coma on pattern shift are fairly well-known and numerical methods can be used to ray trace or model the behavior (determine pattern shift as a function of source shape, feature size and optical parameters) when the Zernike terms are known. In general, the coma aberration can be split into two terms, x-coma and y-coma. Where x-coma is responsible for shifting and/or degrading vertical features and y-coma shifts and/or degrades horizontal features. Since, in general, the Zernike polynomial expansion contains many significant terms (up to several hundred depending on the lens) it is hard to perform lithographic experiments that isolate the effects of one particular Zernike term, without complex assumptions. See, for example, "Experimental Assessment of Pattern and Probe-Based Aberration Monitors", G. Robins, A. Neureuther, *SPIE, Microlithography Proceedings*, Vol. 5040-149, pp. 1:12, 2003, and "Aberration Measurement of Photolithographic Lenses by Use of Hybrid Diffractive Photomasks", supra. One method of determining the Zernike coefficients using an in-situ interferometer is described in "Apparatus, Method of Measurement and Method of Data Analysis for Correction of Optical System", A. Smith et al., U.S. Pat. No. 5,828,455 issued Oct. 27, 1998.

Distortion

A conventional method for determining lens distortion in the presence of aberrations (FIG. 1c) is described in "Analysis of Image Field Placement Deviations of a 5× Microlithographic Reduction Lens", D. MacMillen et al., *SPIE* Vol. 334, pp. 78-89, 1982, where it is tactically assumed that the stepper or scanner wafer stage moves in a nearly perfect manner. Under the assumptions of a perfect wafer stage (stage error small and randomly distributed) one prints a large array of box-targets or alignment attributes (FIG. 2a) across the exposure field. Next, the stepper or scanner is programmed to step and print one small overlay target box inside each of the previously imaged field points (creating readable alignment attributes or a box-in-box target) using a constant aberration portion of the lens. One then determines (estimates) the lens distortion by measuring the feature-shift of the array (FIG. 1d) using an optical metrology tool and several modeling equations that account for additional overlay errors and statistical fluctuations. See, for example, "Measuring Fab Overlay Programs", supra, "KLA 5105 Overlay Brochure", KLA-Tencor, "Quaestor Q7 Brochure", *Bio-Rad Semiconductor Systems*, and "Measuring Fab Overlay Programs", supra. In general, it is common to ignore the effects of third-order or higher coma on large-feature-shift and to assume that the large-pattern shifts are entirely due to the effects of Zernike tilt terms of low order (a2 and a3 for example) or other easily modeled global shifts. In fact, as mentioned previously, even semiconductor fab overlay procedures disregard the effects of coma on overlay targets altogether.

Several preferred methods for determining lens distortion for steppers (or scanners) are described by A. Smith in U.S. patent application Ser. No. 10/252,021, supra, U.S. patent application Ser. No. 10/252,020, supra, and U.S. Pat. No. 6,573,986, supra. Smith describes a sequence of lithographic exposures and measurements using a novel reticle pattern to mathematically solve for lens distortion in the presence of stage noise and synchronization error. In addition, these preferred methods can be used to determine the Zernike tilt coefficients (a2 and a3) by subtracting off the effects of third-order (or higher order aberrations) if the aberrations for the lens are known. If the aberrations are not known then techniques such as those described by U.S. Pat. No. 5,828,455 can be used to determine the Zernike coefficients (x-coma and y-coma a8 and a7 for example) as a function of field position for both steppers and scanners. Once the coma coefficients are known (as a function of field position), a2 and a3 can be determined by subtraction.

For the preferred methods such as described in U.S. patent application Ser. No. 10/252,020, supra or U.S. Pat. No.

6,573,986, supra, lens distortion is determined by measuring arrays of alignment attributes (using standard overlay methods), solving a complex system of equations and then subtracting off both global and statistical sources of error. The results for lens distortion can be reduced to a simple linear combination of X, Y tilt and X, Y primary (third-order) coma, where higher order contributors are ignored. This relationship is shown in Equation 2.

$$(DX, DY) = (a2*dX/da2 + a8*dX/da8, a3*dY/da3 + a7*dY/da7) \quad \text{(Eq. 2)}$$

where:
  DX, DY represent field dependent pattern shifts as determined by the technique of U.S. patent application Ser. No. 10/252,020, supra, U.S. Pat. No. 6,573,986 and the like;
  $a2$, $a3$ are Zernike x-tilt and y-tilt coefficients, each a function of field position;
  $a7$, $a8$ are primary Zernike y-coma and x-coma coefficients, each a function of field position;
  $dX/da2 = dX/da3 = (x,y)$ tilt shift coefficients $= -\lambda/na*\pi$;
  $dX/da8$, $dY/da7 = (x,y)$ coma shift coefficients = complex function of source shape and feature pattern; and
  $\lambda$, NA = projection tool wavelength, exit pupil NA In general, if the coma coefficients $a7$ and $a8$ are known (across the exposure field or slot) one then calculates (simulates) feature-shift versus coma coefficient ($a7$, $a8$ or both) for a given source shape and feature-size and arrives at a good estimate of $dX/da8$ and $dY/da7$. Then, $a2$ and $a3$ can be estimated by manipulation of Equation 2.

$$a2, a3 = [(DX - a8*dX/da8)/(dX/da2), (DY - a7*dY/da7)*dY/da3)]. \quad \text{(Equation 3)}$$

While several methods are known for determining lens distortion, an improved determination of lens distortion can be obtained if the cross coupling effects of third-order coma and tilt on transverse distortion are reduced or eliminated. These known methods would need knowledge of the Zernike coefficients (especially third-order coma) as a function of field position to eliminate the cross coupling effects of third-order coma and tilt on transverse distortion. Therefore, it would be desirable to have a process for determination of $a2$ and $a3$ in the presence of low order coma aberrations when it is not possible or convenient to determine a complete set of Zernike coefficients for a lens system and process.

SUMMARY

Illumination source conditions for the accurate determination of Zernike tilt coefficients in the presence of coma are described. Overlay alignment attribute-specific feature-shift coma sensitivity is simulated for a range of illumination conditions. The resulting source sensitivity data is modeled and a practical array of source shapes, each of which is optimized to eliminate the effects of transverse distortion due to third-order coma, is identified. The optimized set of source shapes can be used to more accurately determine Zernike terms $a2$ and $a3$ from lens distortion data (DX, DY). Knowledge of the lens distortion data in the absence of coma induced shifts can be entered into more traditional overlay regression routines to better identify systematic and random error or used to design better slot geometries during scanner assembly (see FIG. 4a). Additional applications of the above outlined process include: improved lithographic simulation using conventional optical modeling software, advanced process control in the form of feedback loops that automatically adjust the projection lens for optimum system performance.

In one aspect, a process for providing illumination conditions for accurate determination of Zernike tilt coefficients in the presence of third-order coma for a lithographic projection system includes selecting an optimized illumination condition, performing a lens distortion test method using an optimized illumination condition selected from the determined illumination conditions, and constructing a lens distortion map in accordance with the collected illumination conditions and calculating Zernike tilt terms $a2$ and $a3$ in accordance with the lens distortion map such that the calculated Zernike tilt terms correspond to calculations in the absence of the effects of third-order coma for field positions of interest. The selected optimized illumination condition can be selected by simulating a feature-shift in a scanning system of the lithographic projection imaging system in accordance with input parameters of interest and a range of illumination conditions, determining illumination conditions within the range that significantly reduce large feature shifts that are due to third-order coma, and collecting the determined illumination conditions to enable the accurate determination of Zernike tilt coefficients. Alternatively, the selection can occur through use of a look-up table that can be generated through such feature-shift simulation and determining of illumination conditions and Zernike tilt coefficients.

Other features and advantages of the present invention should be apparent from the following description of the preferred embodiment, which illustrates, by way of example, the principles of the invention.

BRIEF DESCRIPTION OF THE DRAWINGS

The features of this invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction the accompanying drawings in which:

FIG. 2a shows typical alignment attributes.
FIG. 2b shows the coordinate system for overlay measurement.
FIG. 6a quadrapole illumination conditions exhibiting zero coma sensitivity to large feature-shift NA=0.6.
FIG. 6b quadrapole illumination conditions exhibiting zero coma sensitivity to large feature-shift NA=0.9.

DETAILED DESCRIPTION

Observations

Figure 1A:
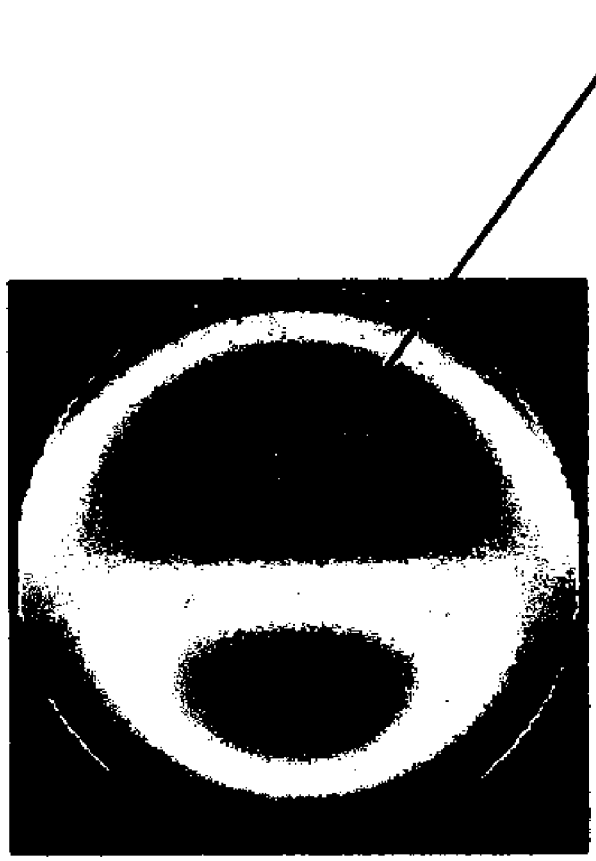
FIG. 1a shows a typical x-coma aberration phase plot in the exit pupil.
Figure 1D:
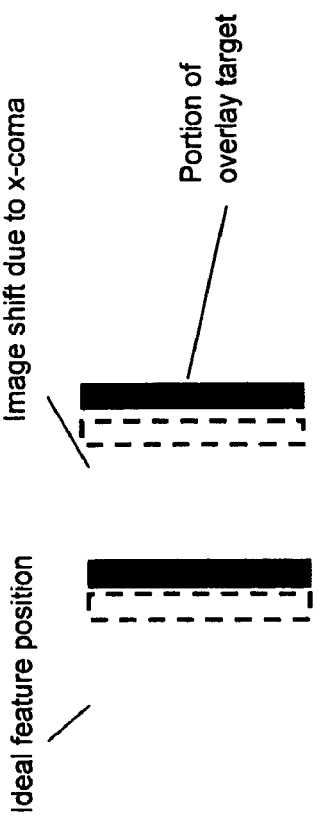
FIG. 1d shows image shift due to x-coma.
Figure 1E:
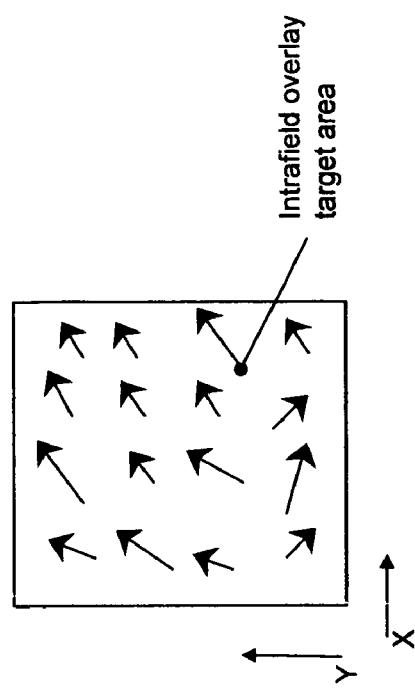
FIG. 1e shows a distortion plot with the effects of coma removed.

The thrust of this invention stems from several observations. First, both tilt and third-order coma aberrations are responsible for the largest portion of aberrated feature-shift (excluding other lithographic effects: lens tilt, reticle tilt, global overlay offsets, etc.) for the large $$\left(\text{e.g.,} \left(\frac{\lambda}{NA}\right)\right)$$

features typically used in overlay targets. Second, coma aberrations cause large feature patterns (reticle or mask patterns) to shift more than small feature patterns. This characteristic is important because overlay targets or alignment attributes are in general much greater than $\lambda/2*NA$. Typical frame-in-frame alignment attributes are ~2 um, and $\lambda/2*NA$ are on order 200 nm for 248 nm lithography. Thus, portions of these large patterns are shown in FIG. 1d) and are used for overlay and distortion methods. Third, third-order coma is, in general, a larger contributor of pattern shift as compared with other higher-order aberrations (such as trifoil, etc.). Fourth, the amount of shift is related to source geometry, as noted from Equation 1 above. See, for example, "Impact of Lens Aberrations on Optical Lithography", supra.

PROCESS FOR THE PREFERRED EMBODIMENT

Figure 3:
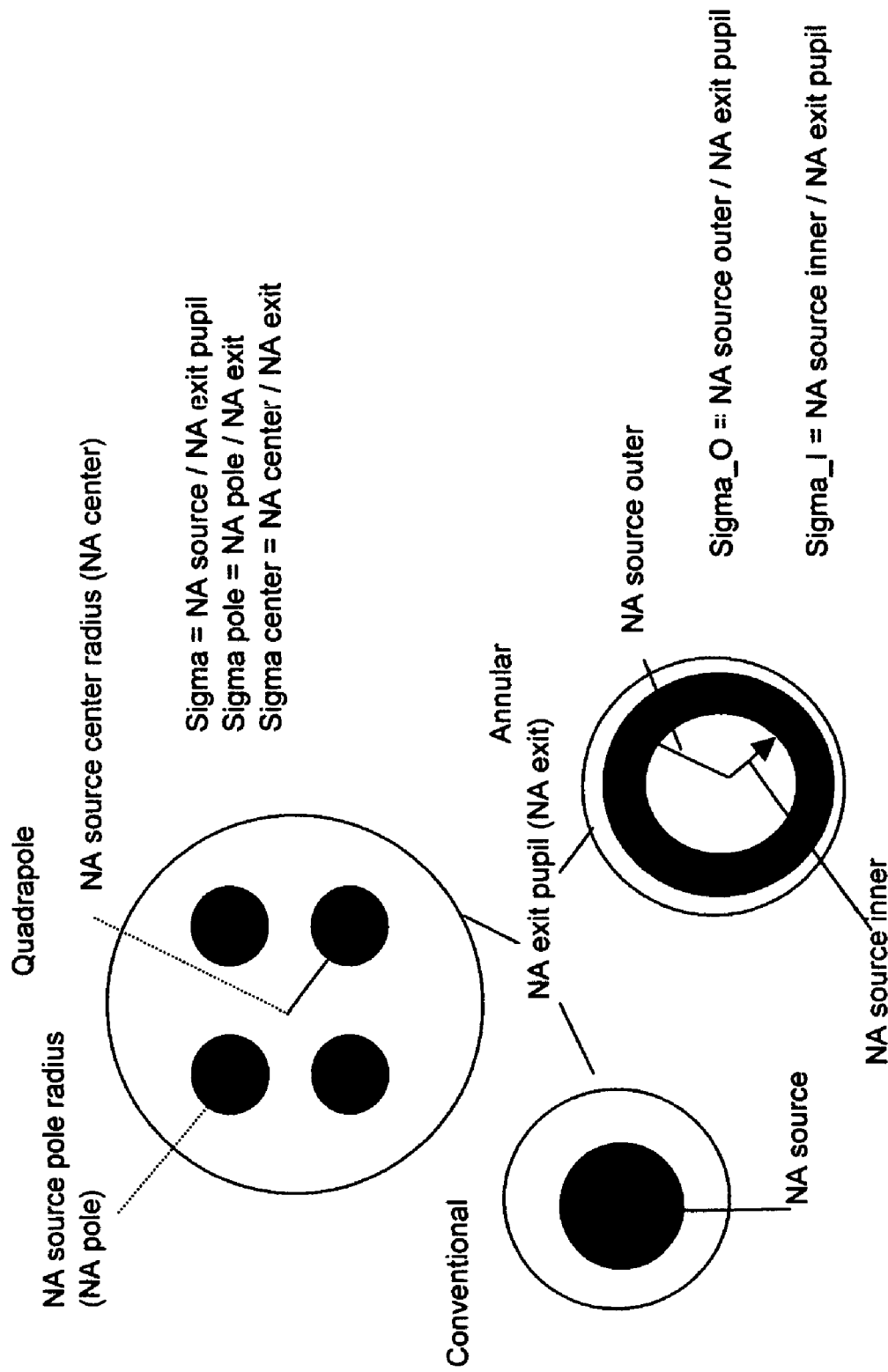
FIG. 3 shows symmetric illumination conditions and source geometry.
Figure 4A:
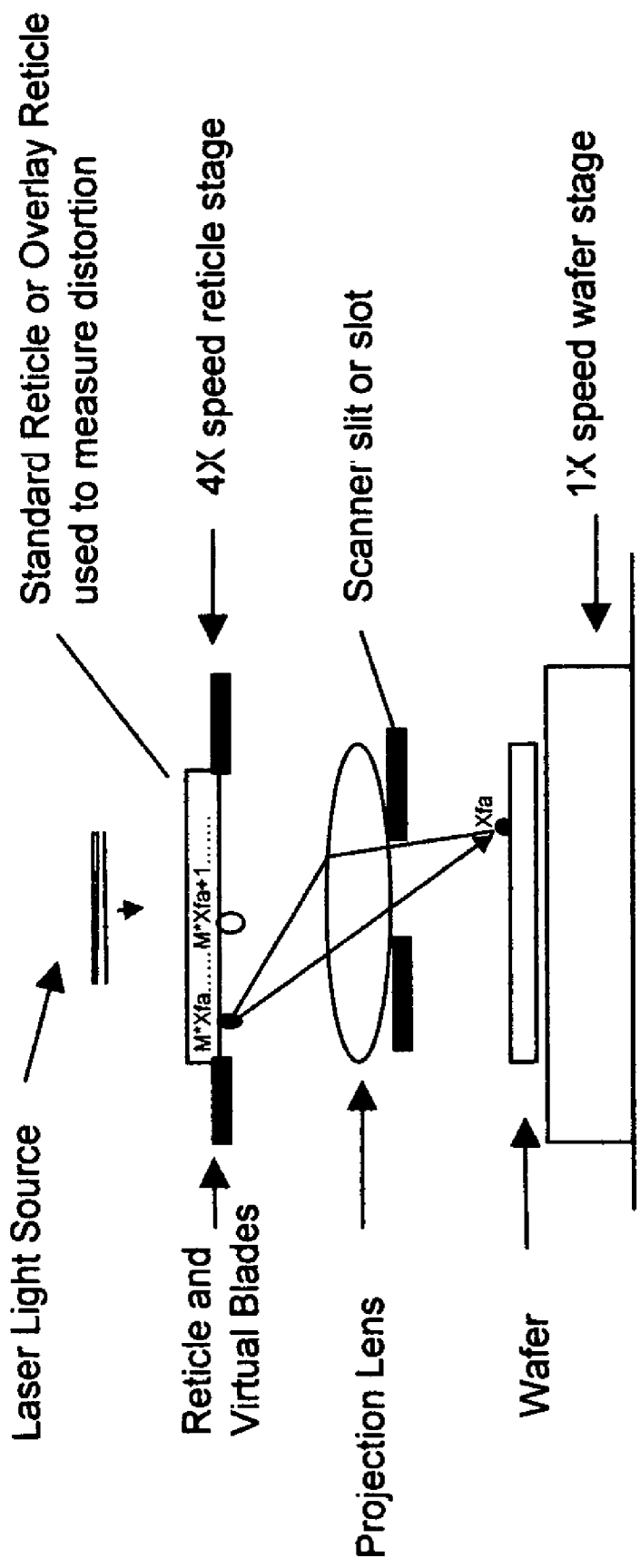
FIG. 4a shows a scanner system.
Figure 4B:
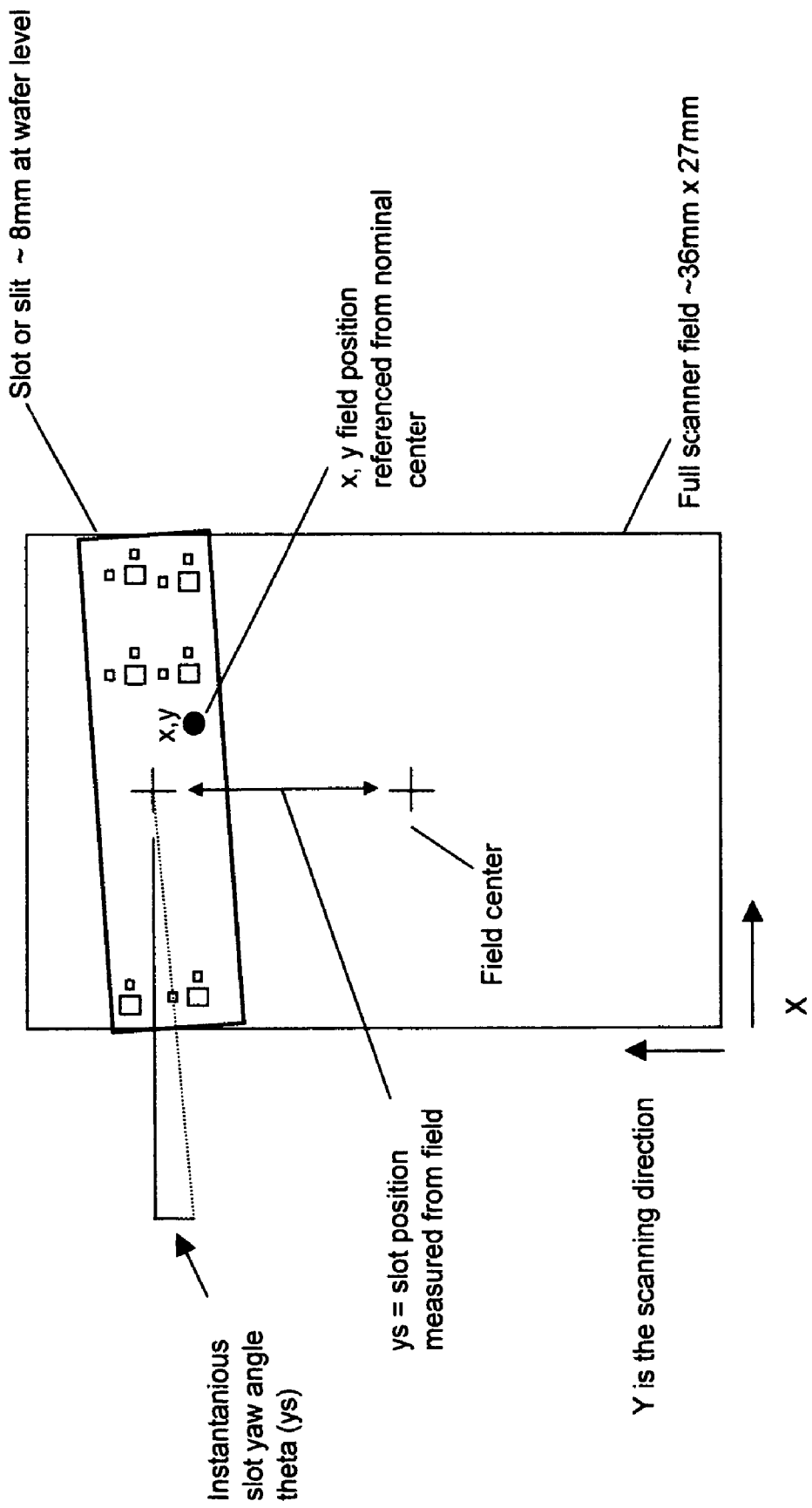
FIG. 4b shows scanner slot coordinate system and field points.
Figure 7A:
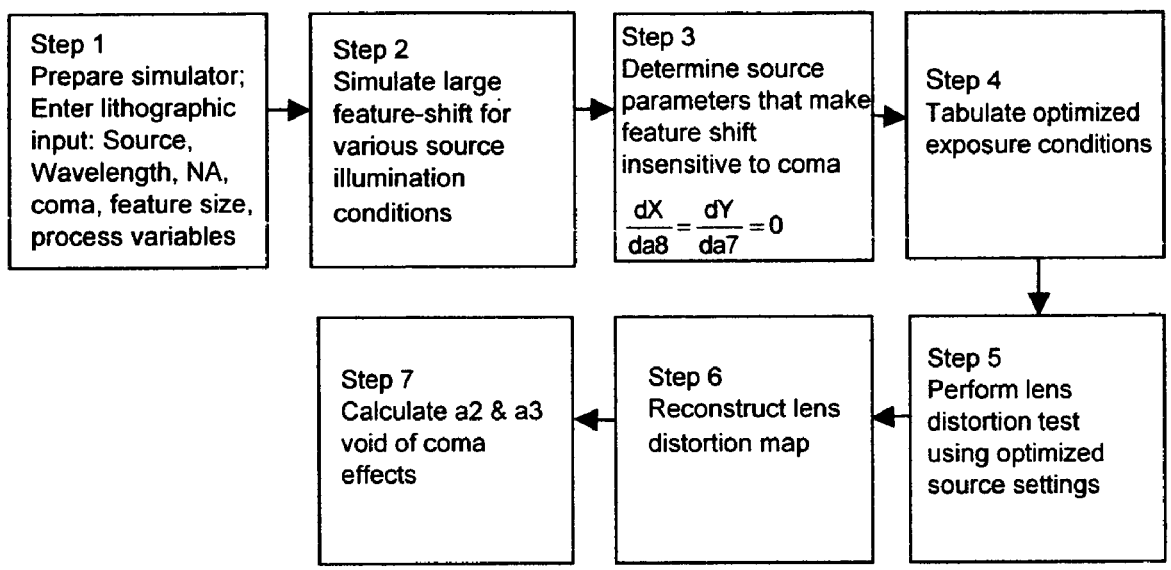
FIG. 7a shows the process flow for the preferred embodiment.

The main point of discussion will be symmetric lithographic imaging sources (see FIG. 3). For simplicity, description of the preferred embodiment is provided in terms of x-coma. Those skilled in the art will understand that, for symmetric imaging systems, the invention can be applied to y-coma as well. The overall process flow is shown in FIG. 7a, which illustrates the sequence of operations performed by a photolithography projection imaging system in which the scanner system of FIG. 4a is installed. FIG. 4a is a standard system or system with an overlay reticle used at the zero coma illumination condition. FIG. 7a illustrates a process in which illumination settings for the imaging system are determined through simulation of large feature shifts.

Step 1: In the first operation of the imaging system, as illustrated in FIG. 7a, lithographic parameters are entered into a lithographic or electromagnetic/optics simulator; these parameters include but are not limited to: source NA, exit pupil NA, identifier for the mask geometry, resist process parameters (real and imaginary index of refraction, thickness, diffusion, development model), wavelength, x-coma or y-coma Zernike coefficients a8, a7 (where, for a good lens system, the coma Zernike coefficients are ~5 m$\lambda$-50 m $\lambda$ rms), and other lithographic inputs. These parameter inputs can include such as those found in "Aberration Measurement of Photolithographic Lenses by Use of Hybrid Diffractive Photomasks", supra.

Step 2: simulations are carried out to model overlay alignment specific feature shift (typically features much larger than $\lambda/2*NA$) as a function of source geometry or illumination conditions.

Step 3: illumination conditions that exhibit zero featureshift for either vertically and horizontally oriented features in the presence of coma are identified (i.e., dX/da8, dY/da7=0). Where dX/da8 and dY/da7 represent the featureshift slope response for x-coma and y-coma (see FIG. 5b). Note that, for good lens systems, the Zernike coefficients (a7 and a8) are typically small and vary slowly across the exposure field (or slot) and the slope dX/da8 or dY/da7 is approximately a constant, implying that only one optimized illumination condition is needed to map the entire exposure field.

Figure 5A:
FIG. 5a shows practical illumination conditions exhibiting zero coma sensitivity to large feature-shift.
Figure 5B:
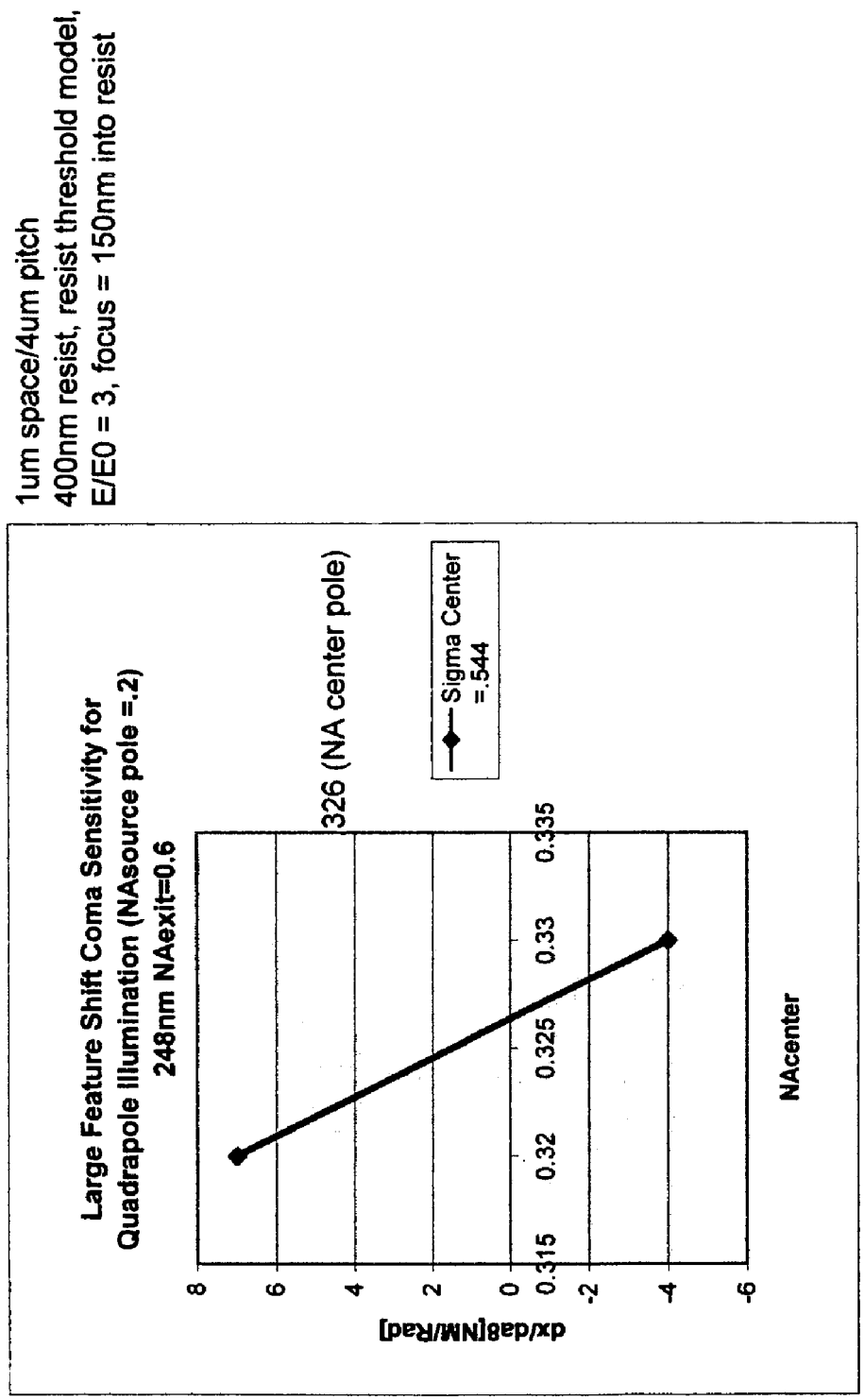
FIG. 5b shows large feature shift coma sensitivity for quadrapole illumination.

Step 4: a table is constructed showing an optimized set of illumination conditions (see FIGS. 5a, 6a-6b).

Application (Steps 5-6)

Most methods for determining distortion rely on overlay methods (see description of related art, above); the distortion measurements cannot be used to solve for the Zernike coefficient for tilt (a2 and a3) in the presence of coma unless one is privy to the coma coefficients via some other method, such as described in U.S. Pat. No. 5,828,455, supra. In accordance with the present invention, an illumination source or geometry is provided for which the effect of coma (namely, third-order coma) on pattern shift is nearly eliminated, allowing for a direct estimate of the Zernike tilt coefficients a2 and a3 (as a function of field position). This is described by the following application steps.

It should be noted that the present invention can be applied to photolithographic steppers, scanners, e-beam systems, EUV, and x-ray imaging systems. See, for example, Mix-and-Match: A Necessary Choice", supra, "Reduction Imaging at 14 nm Using Multilayer-Coated Optics: Printing of Features Smaller than 0.1 Micron", J. Bjorkholm et al., *Journal Vacuum Science and Technology*, B 8(6), pp. 1509-1513, November/December 1990, "Development of XUV Projection Lithography at 60-80 nm", B. Newnam et al., *SPIE*, Vol. 1671, pp. 419-436, 1992, and "Optical Lithography—Thirty Years and Three Orders of Magnitude", J. Bruning, *SPIE*, Vol. 3051, 1997).

PREFERRED EMBODIMENT

A particular process for providing an illumination source for the accurate determination of Zernike tilt coefficients in the presence of coma in accordance with the invention is described. Large feature-shift coma sensitivity is simulated for a range of illumination conditions. The resulting source sensitivity data is modeled and a practical array of source shapes, each of which is optimized to eliminate the effects of transverse distortion due to third-order coma, is identified. In this way, the present invention provides a process for providing an illumination source for which the effects of coma (third-order) on overlay alignment attributes feature-shift are eliminated, and lays out the details to calculate a2 and a3 more accurately using a photolithographic exposure tool and a variety of distortion measurement methods. Before describing the step-by-step process for the preferred embodiment and practical applications, we formulate third-order coma in terms of ray vectors and describe the relationship between source shape and large feature-shift. Coma (for example, x-coma) can be expressed in several ways (see Equation 1 above). Another useful formulation shows the dependence on optical path difference (OPD) versus ray geometry and NA more clearly:

$$OPD = a8 * Sqrt(8) * (nx/NA) * (3*(nx/NA)^2 + 3*(ny/NA)^2 - 2) \quad (Eq. 4)$$

where nx, ny are ray direction cosines exiting the aperture, NA is the exit pupil numerical aperture, and a8 is the Zernike x-coma coefficient (RMS).

Note that while Equation 4 shows the relationship for arbitrary illumination, the source shape and feature geometry clearly impact ray tracing since rays arriving from different source positions arrive at the mask at different angles and therefore enter the optical system via diffraction differently. Different source shapes will in general cause varying degrees of feature-shift, and large features shift more than smaller features. Since most photolithographic exposure tools use conventional, annular, or quadrupole illumination, we focus our attention on the details of these systems and the interaction with coma (x-coma, for example) on large feature-shift. Commercial lithographic simulation engines such as ACE™, PROLITH™, and SOLID-C™ known to those skilled in the art can be used to calculate overlay alignment attribute feature-shift versus source shape for a variety of conditions. For this description of the illustrated embodiment, the "ACE" simulation engine from Litel Instruments (assignee of the present invention) is used. See "Examples of Illumination Source Effects on Imaging Performance", de Ruyter et al., Arch Chemicals Microlithography Symposium, Sep. 22, 2003. Again, large feature-shift is important because the overlay targets or alignment attributes are typically used in determining projection lens distortion.

It is important to note that because the coma Zernike coefficients are rather small (on order of 1 m$\lambda$-50 m$\lambda$), and vary slowly over the exposure field or slot, only one optimized set of source shapes is needed for the preferred invention because, in general, the optimized illumination conditions (dX/da8, dY/da7=0) will not be a function of field position, to good approximation. The optimized set of source shapes (illumination conditions) can be used to accurately determine the Zernike terms a2 and a3 as a function of field position using the following process (see FIG. 7a):

Step 1: lithographic parameters are entered into a lithographic or electromagnetic/optics simulator. As before, these parameters include but are not limited to: source NA, exit pupil NA, description of the mask geometry (such as 1-D, 2-D, or 3-D), resist process parameters (real and imaginary index of refraction, thickness, development model), wavelength, coma Zernike coefficients (any convenient value between 5 m$\lambda$-25 m$\lambda$ for a suitable lens system). Other lithographic inputs, such as those found in "Aberration Measurement of Photolithographic Lenses by Use of Hybrid Diffractive Photomasks", supra, can be included, depending on system operation needs.

Step 2: simulations are carried out to model overlay alignment attribute specific feature-shift as a function of source geometry (shift versus source shape parameters). For example, because symmetric sources are considered, one can choose to model vertical features and the interaction with x-coma (a8).

Step 3: determine the (optimized) illumination conditions such that the alignment attribute feature-shift is reduced to zero in the presence of coma (i.e., dX/da8, dY/da7=0). Those skilled in the art will understand that this can be obtained by plotting feature-shift coma sensitivity versus source illumination parameters (using NA or sigma notation) and identifying the position at which the (nearly linear) response plot crosses zero (see FIG. 5b). For symmetric sources, the illumination parameters are: $\sigma$ sigma=Nas/NA) for conventional illumination, $\sigma$ inner and $\sigma$ outer for annular illumination, and $\sigma$ pole and $\sigma$ center radius for quadrapole illumination (see FIG. 3).

Step 4: create a table listing the optimized illumination conditions (see FIGS. 6a-6b, for example).

Steps 5 and 6: perform a lens distortion test method using the optimized illumination condition. A preferred lens distortion for static fields is described in U.S. Pat. No. 6,573, 986 supra, and for dynamic fields is described in U.S. patent application Ser. No. 10/252,020 supra. Stage displacement is another. See also "Analysis of Image Field Placement Deviations of a 5× Microlithographic Reduction Lens", supra. The end result of carrying out any of these methods will be a lens distortion map (DX, DY) (x,y).

Step 7: calculate the Zernike tilt coefficients a2 and a3 using dX/da2=dY/da3=$\lambda/\pi$*NA and Equation 3 above for the field points of interest, e.g.

$$(a2, a3)(x, y) = \left( DX(x, y) \Big/ \frac{dX}{da2}, DY(x, y) \Big/ \frac{dY}{da3} \right) \quad \text{(Equation 5)}$$

Because we are operating the method of reference (Step 5) at an illumination condition where the coma influence effectively vanishes (dX/da8=dy/da7=0), the measured distortion is directly proportional to the x and y tilt Zernike coefficients a2 and a3.

Illumination Results

Figure 8A:
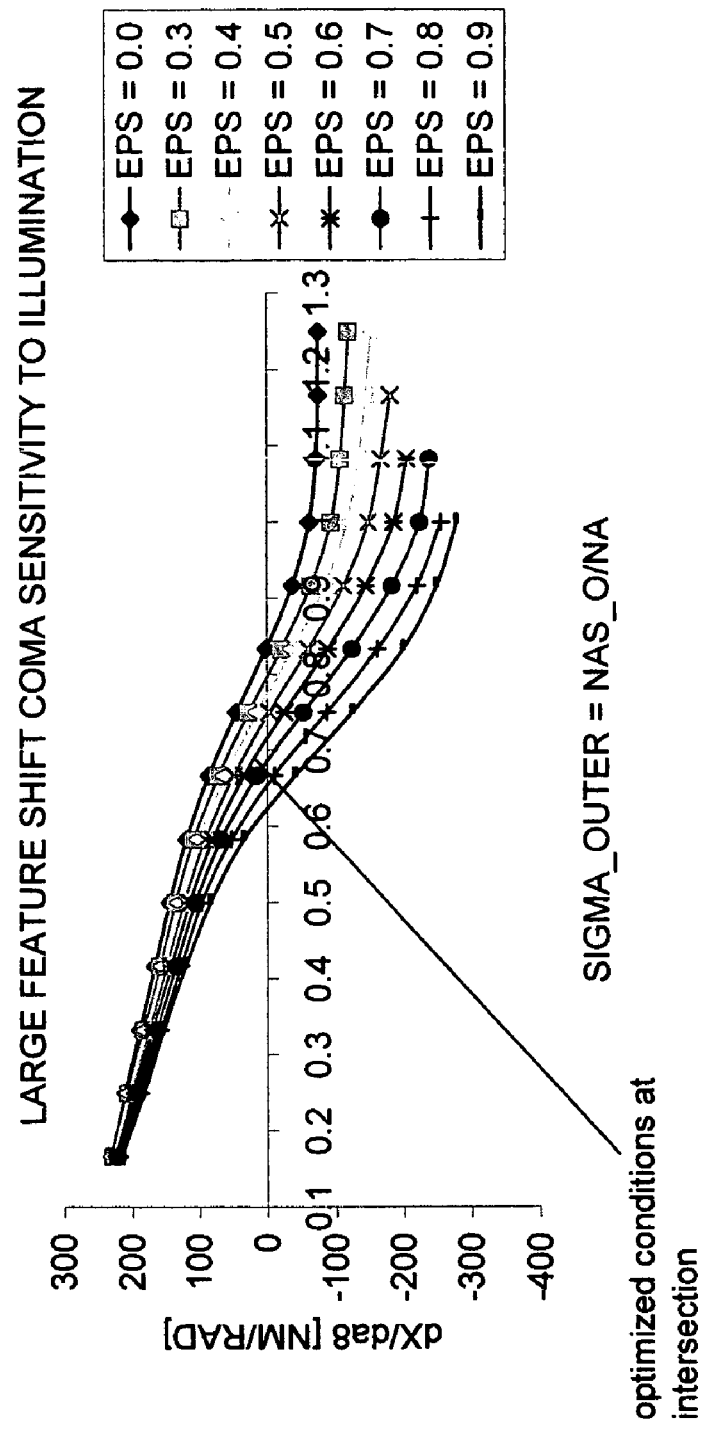
FIG. 8a shows large feature sensitivity for several illumination conditions for 248 nm NA=0.6.
Figure 8B:
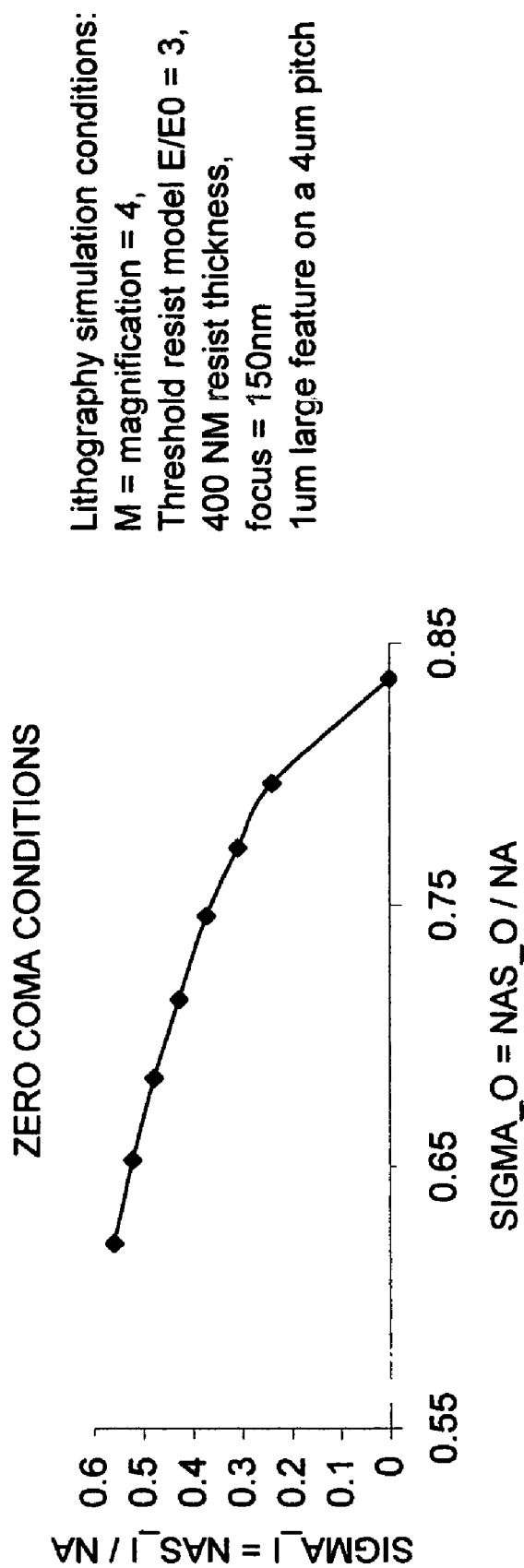
FIG. 8b shows illumination conditions exhibiting zero coma sensitivity for large feature shift 248 m NA=0.6.
Figure 9A:
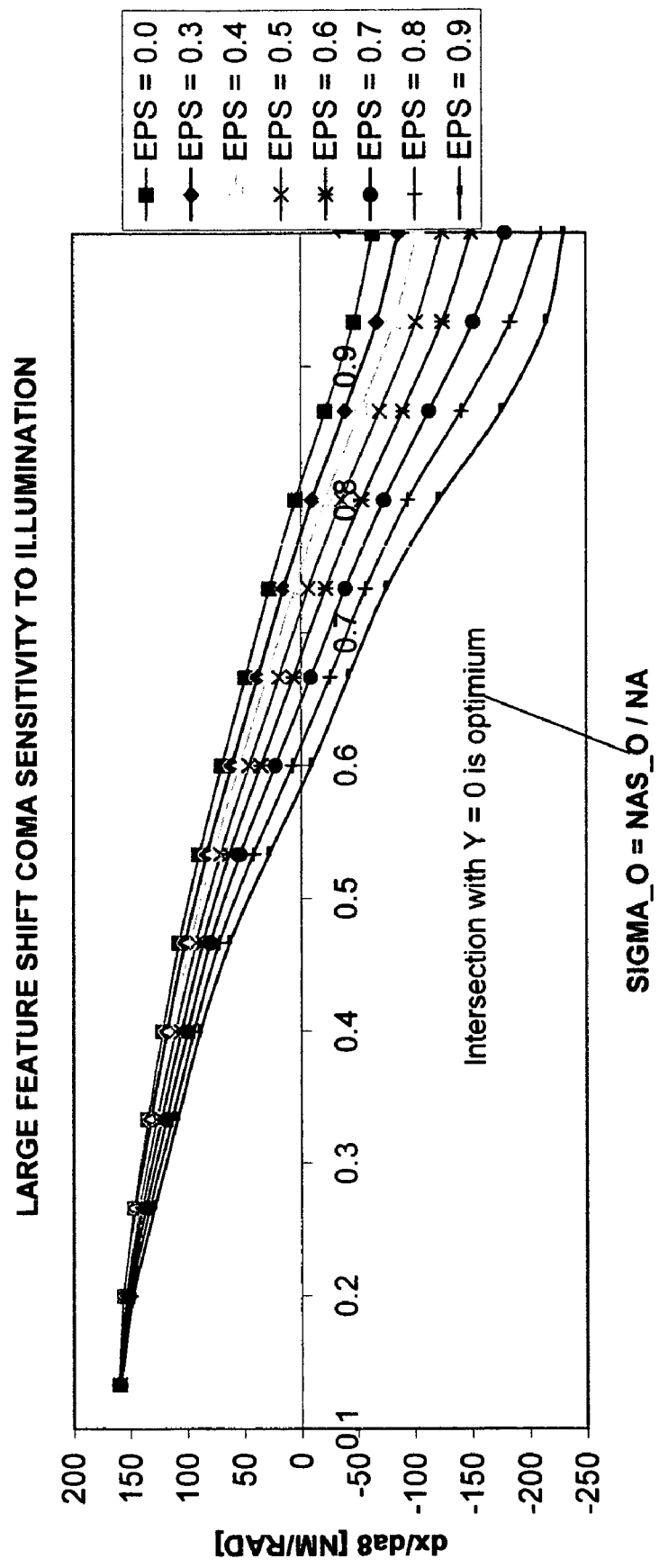
FIG. 9a shows large feature sensitivity for several illumination conditions for 193 nm NA=0.75.
Figure 9B:
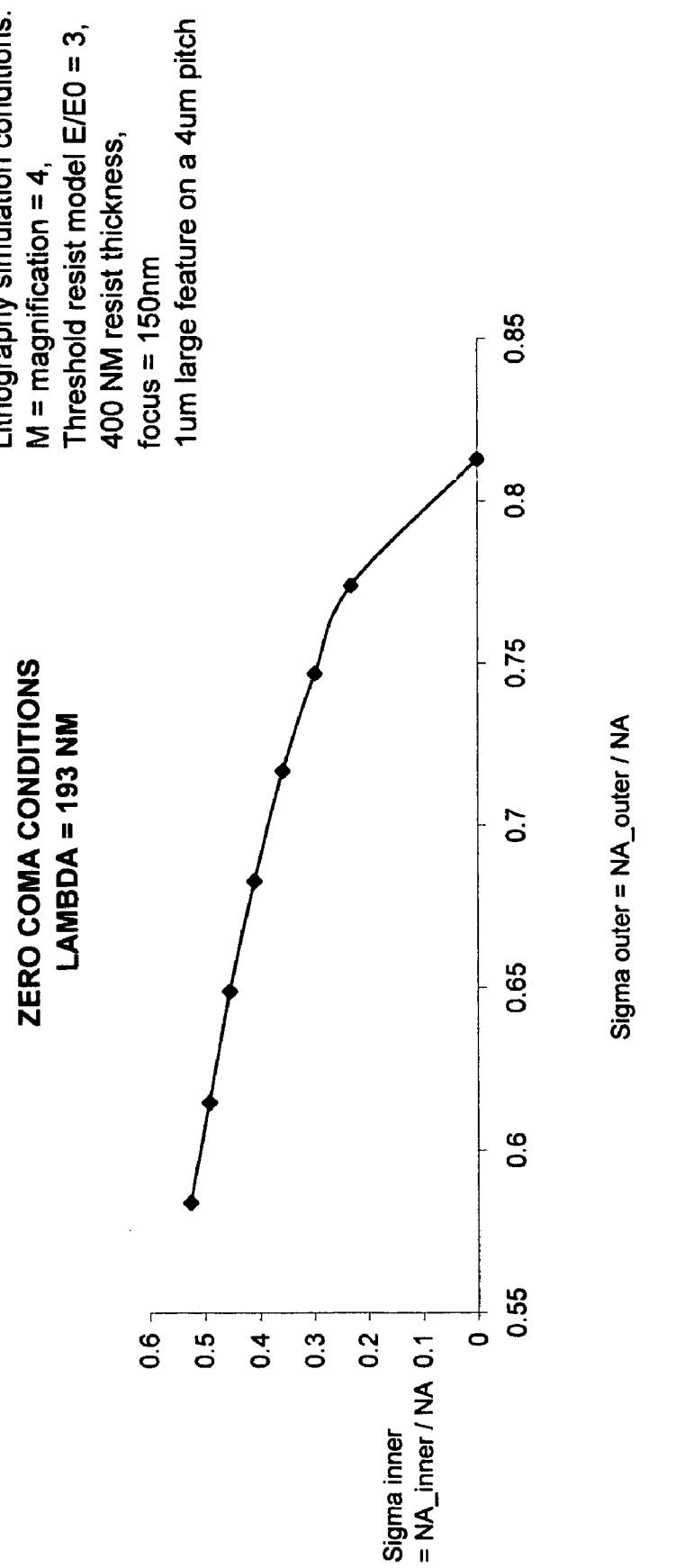
FIG. 9b shows illumination conditions exhibiting zero coma sensitivity for large feature shift 193 nm NA=0.75.

Some simulation results (optimized illumination conditions) using the method of the preferred embodiment are shown in FIGS. 6a-6b (248 nm and 193 nm quadrapole), FIG. 8b (248 nm annular), and FIG. 9b (193 nm annular). FIG. 5a shows a summary table of optimized (dX/da8, dY/da7=0) illumination shapes (annular and conventional) that are generally accessible or practical—where sigma outer is <0.8 and EPS <0.75. Where EPS represents the ratio of sigma outer to sigma inner (FIG. 3). The table shown at the bottom of FIG. 5a is constructed by finding the zeros of the large feature-shift coma sensitivity plot shown in FIG. 8a.

Figure 10A:
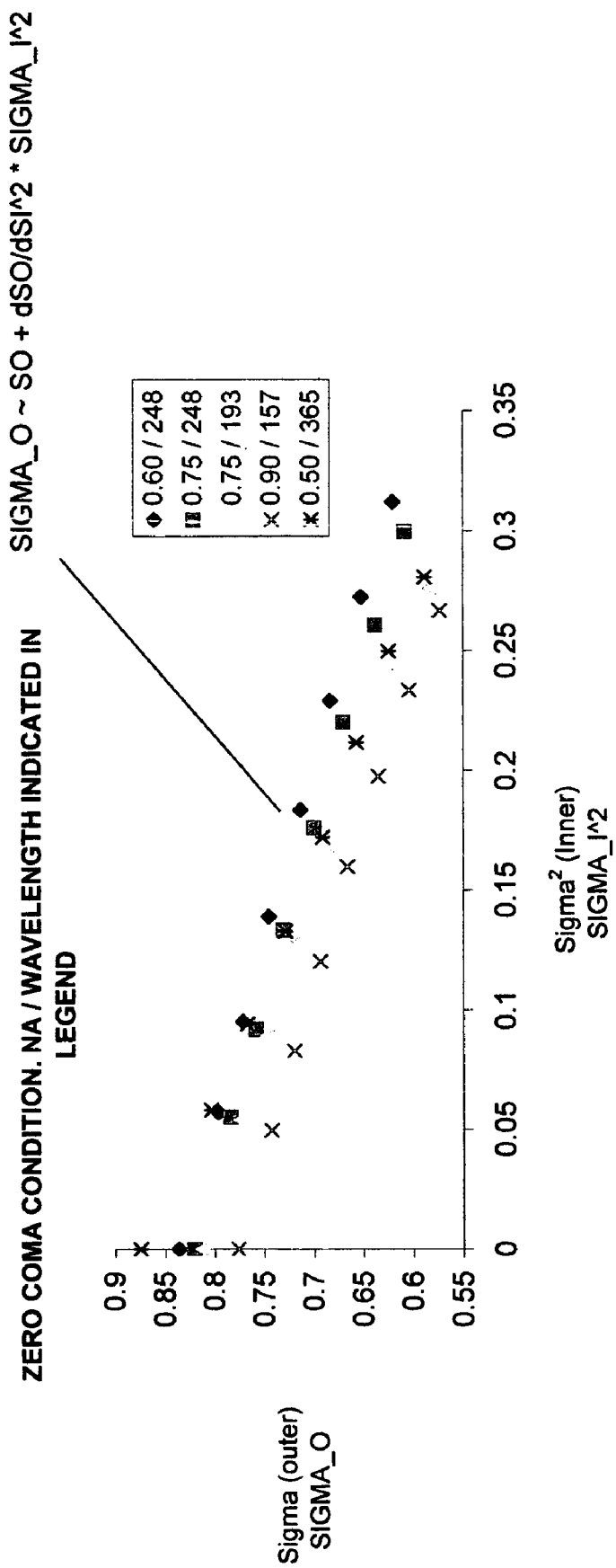
FIG. 10a shows a plot of annular illumination conditions exhibiting zero coma sensitivity for various NA/$\lambda$ pairs.
Figures 10B, 10C:
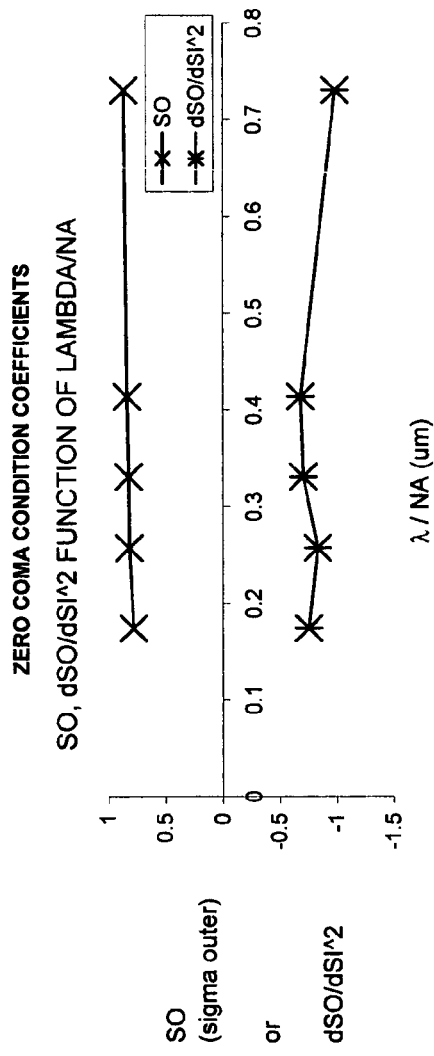
FIG. 10b shows a plot of the fitting coefficients as a function of $\lambda$/NA.
FIG. 10c shows a table showing the fitting coefficients as a function of $\lambda$ and NA with fit parameter RSQ.

The data for annular illumination conditions (see FIG. 3) for a range of wavelengths and numerical apertures is summarized in FIGS. 10a-10c, where one can fit with good confidence (RSQ~0.99, see table in FIG. 10c) the optimized sigma outer (σ outer position) as a quadratic function of:

$$\sigma - \text{inner}\left(\sigma \text{ outer}(\sigma \text{ inner}) \sim \sigma \text{ outer} + \frac{d^2\sigma - \text{outer}}{d\sigma - \text{inner}^2} * \sigma \text{ inner}^2\right),$$

where the coefficients for the fit $$\left(\sigma \text{ outer and} \frac{d^2\sigma - \text{outer}}{d\sigma - \text{inner}^2}\right)$$

are functions of the wavelength and NA, as shown in FIG. 10b. While not exhaustive, the simulations for annular, conventional, and quadrapole illumination are valid over very large ranges of the lithographic simulation parameters. For example, for feature sizes in the range of ~0.5 um-4 um and for coma in the range of ~1 mλ-50 mλ.

ALTERNATIVE EMBODIMENT

Figure 7B:
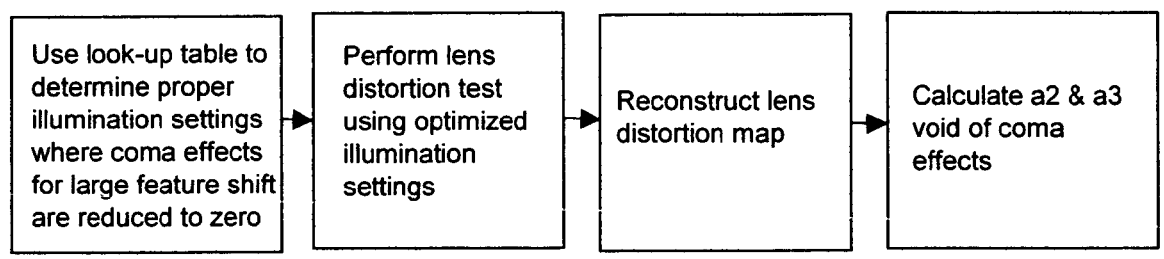
FIG. 7b shows the process flow for a variation of the preferred embodiment using look-up tables.

The table data obtained by the simulation can be stored and used in cases where it is not practical or possible to carry out a simulation on the imaging system being operated. FIG. 7b shows a process of determining the Zernike coefficients a2 and a3 using a look-up table rather than a simulation process. In the case of the look-up table process, the imaging system illumination settings are determined through table look-up rather than the simulation process described above. Thus, Step 1 through Step 4 of FIG. 7a, to determine illumination settings prior to the lens distortion test, are not performed in the imaging system of FIG. 7b. Rather, proper illumination settings for performing the lens distortion test are determined by table look-up for settings where coma effects for large feature shift are reduced to zero or near-zero.

Figure 13:
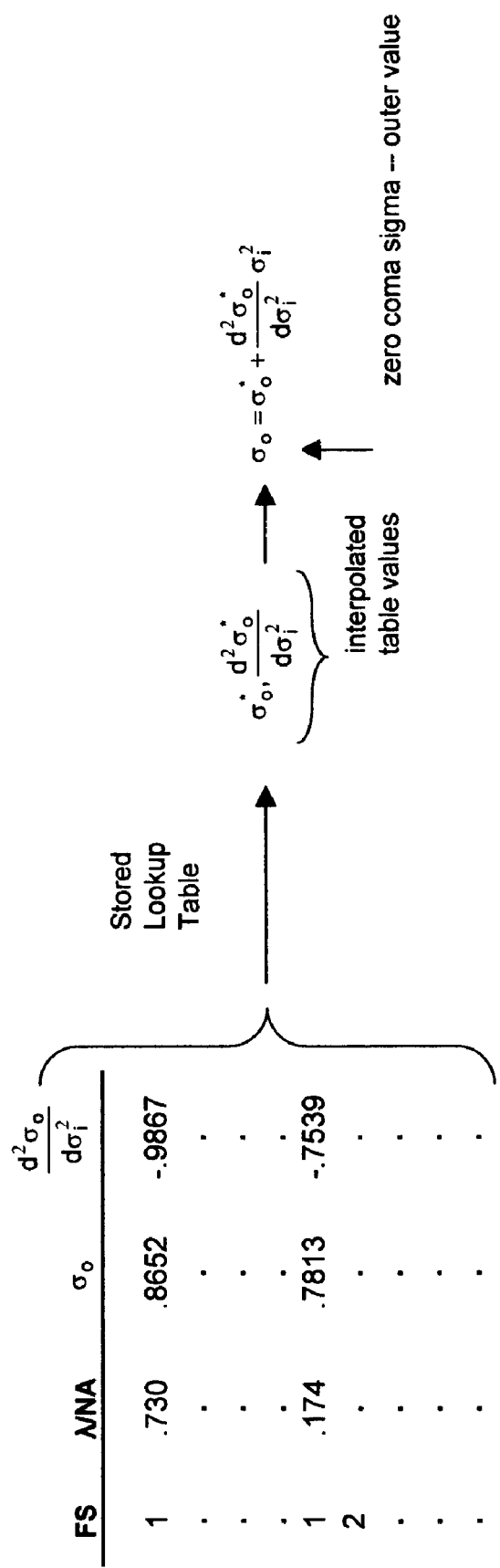
FIG. 13 is a diagram of a stored lookup table and the relationship of table data records to the zero coma illumination condition.

FIG. 13 is a diagram that illustrates the table look-up process. The stored look-up table data can be maintained in machine storage, such as system memory of a computer processor that controls the photolithographic projection imaging system in which lithographic scanning is taking place. FIG. 13 shows that the table data is arranged according to FS, λ/NA, σ outer, and $$\frac{d^2\sigma - \text{outer}}{d\sigma - \text{inner}^2}$$

values from simulations, from which interpolated table values are utilized to determine the optimized illumination settings.

Details on Simulations

Figure 11A:
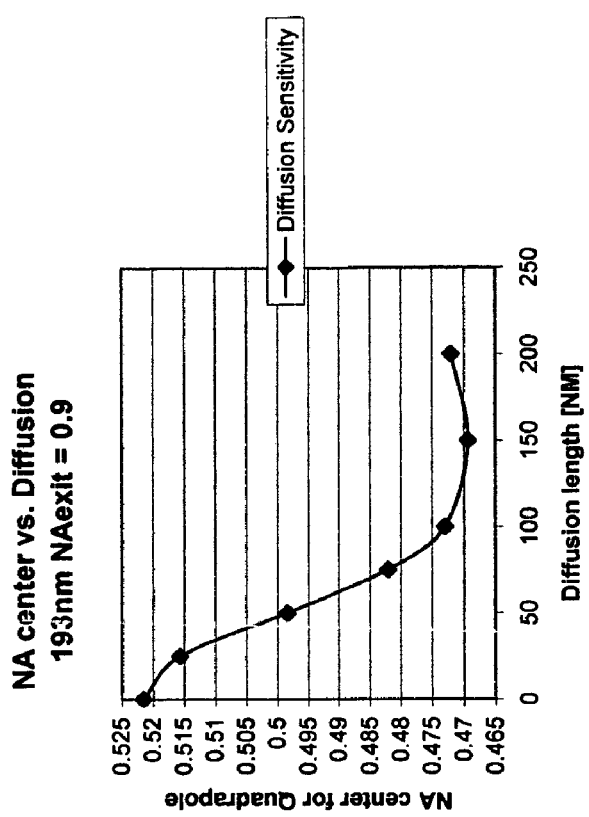
FIG. 11a shows the effect of focus on optimized quadrapole illumination for a system constructed in accordance with the present invention.
Figure 11B:
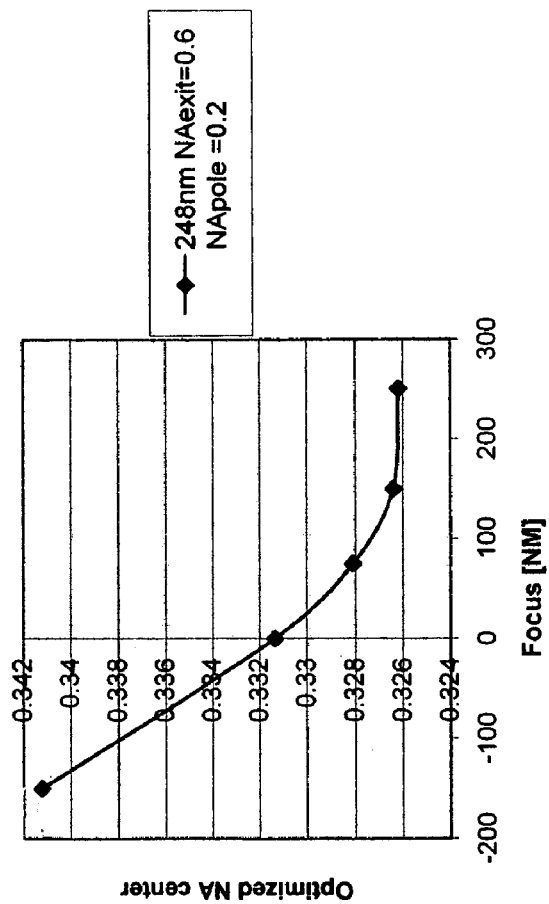
FIG. 11b shows the effect of transverse diffusion on optimized quadrapole illumination for a system constructed in accordance with the present invention.

For practical applications of the invention, it is important to simulate or consider the effects of resist parameters (e.g. index, bleaching, thickness) on optimized illumination conditions (those exhibiting zero sensitivity to large feature-shift in the presence of third-order coma), since the resist acts like a lens and attenuator. See "Influence of Optical Nonlinearities of Photoresist on the Photolithographic Process: Applications", A. Erdmann et al., *SPIE Microlithography Proceedings*, Vol. 3051, 1997. In general, resists exhibit asymmetrical focal behavior and this obviously impacts feature shift due to aberrations. See, "Comprehensive Focus-Overlay-CD Correlation to Identify Photolithographic Performance", Dusa et al., *SPIE*, Vol. 2726-29, 1996. Aerial imaging and lumped parameter models can be used for quick calculations if the effects of defocus are considered. FIG. 11a shows the relationship on focus for optimized quadrapole illumination conditions, as expected the response slope changes rapidly at the air/resist interface. Therefore, we generally should set focus near the resist bottom to where the coma sensitivity is smallest. In addition to focus considerations, the influence on acid/base diffusion should also be considered. FIG. 11b shows a rather complex relationship (third-order) between optimized quadrapole settings and the amount of transverse diffusion.

a2, a3 Error Improvement

The process for the preferred embodiment (Steps 1-7 described directly above) dramatically improves the accuracy of determining the tilt coefficients a2 or a3. For example, for the cases considered in the preferred embodiment where large feature patterns are on the order of ~1 um, the shift for conventional, annular, and quadrapole illumination is on the order of 5 nm when the Zernike coma coefficients (a7, a8) are ~25 mλ. Therefore, we can expect an improvement in the determination of a2 and a3 on the order of approximately DX/(DX-10 nm); for x-tilt=x-coma this is about a 2× improvement.

FURTHER EMBODIMENTS

The process described above for the preferred embodiment is mainly concerned with optimizing symmetric illumination conditions to reduce the effects of feature-shift due to third-order coma for the purpose of accurately determining the Zernike tilt coefficients a2 and a3. Non-symmetric illumination conditions (such as dipole sources, multi-pole, etc.) can be optimized to reduce feature shift for either x-coma or y-coma or both for other applications as well.

While the process for the preferred embodiment has been described mainly in terms of simulation or look-up tables to determine optimized source conditions in the presence of coma, if one is privy to obtaining the a2 and a3 Zernike coefficients, then one can find the optimized coma conditions by lithographic experiment. Because the effects of a2 and a3 can be subtracted from the overlay measurements, this could be useful for those controlling lithography processes using overlay methodologies that ignore the feature-shift due to coma, yet the data corrupts the data base.

Additional applications of the above outlined procedure can include: improved lithographic simulation using conventional optical modeling software, advanced process control in the form of feedback loops that automatically adjust the projection lens or slot for optimum system performance based on knowledge of distortion The present invention has been mainly described with respect to its application on the projection imaging tools (e.g. steppers and scanners) most commonly used in semiconductor manufacturing today. See, for example, "Direct-Reference Automatic Two-Points Reticle-to-Wafer Alignment Using Projection Column Servo System", M. Van den Brink, H. Linders, S. Wittekoek, *SPIE, Optical Microlithography V*, Vol. 633, pp. 60:71, 1986, and "0.7 Na Duv Step and Scan System for 150 nm Imaging with Improved Overlay", J. V. Schoot, *SPIE*, Vol. 3679, pp. 448-463, 1999. The techniques of the present invention, however, also can be applied to other projection imaging tools and systems, such as contact or proximity printers, 2-dimensional scanners, office copy machines, and next generation lithography (NGL) systems such as XUV, SCALPEL, EUV (Extreme Ultra Violet), IPL (Ion Projection Lithography), and EPL (Electron Projection Lithography). See, for example, "Optical Lithography—Thirty Years and Three Orders of Magnitude", supra, "Large Area Fine Line Patterning by Scanning Projection Lithography", H. Muller et al., *MCM 1994 Proceedings*, pp. 100: 104, 1994, "Development of XUV Projection Lithography at 60-80 nm", supra, "Reduction Imaging at 14 nm Using Multilayer-Coated Optics: Printing of Features Smaller than 0.1 Micron", supra, and "Mix-and-Match: A Necessary Choice", supra. Those skilled in the art will understand how to apply the teachings of the present invention to these systems, in view of the description provided herein.

Heretofore we have considered as examples idealized sources, and exit pupils. If we actually know the machine specific source, such as determined by "In-Situ Source Metrology Instrument and Method of Use", B. McArthur et al., U.S. Pat. No. 6,356,345 issued Mar. 12, 2002, and if we also know the exit pupil transmission as a function of nx,ny, then the aforementioned simulations can be carried out with the result that our chosen operating point (illumination condition) will satisfy the zero coma conditions (dX/da8=dY/da7=0) more closely than if we utilized nominal (e.g., manufacturer-specified) values for these quantities.

Figure 1B:
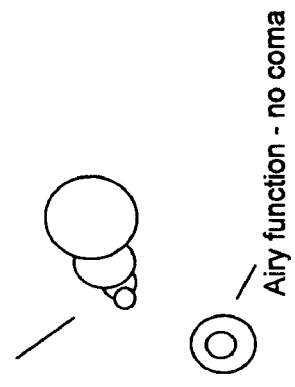
FIG. 1b shows coma flair for a point source.
Figure 1C:
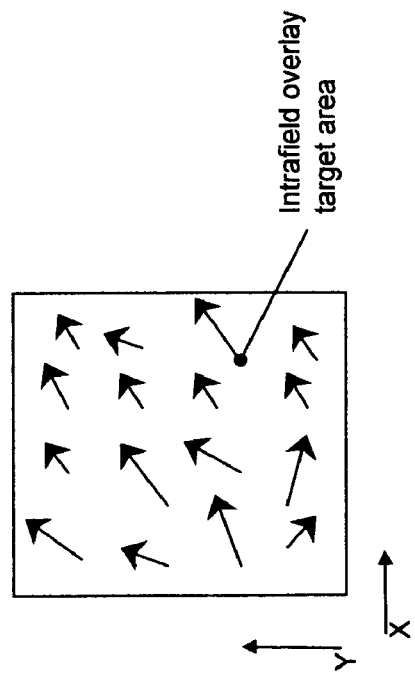
FIG. 1c shows a lens distortion map with contributions from tilt and coma.
Figure 12:
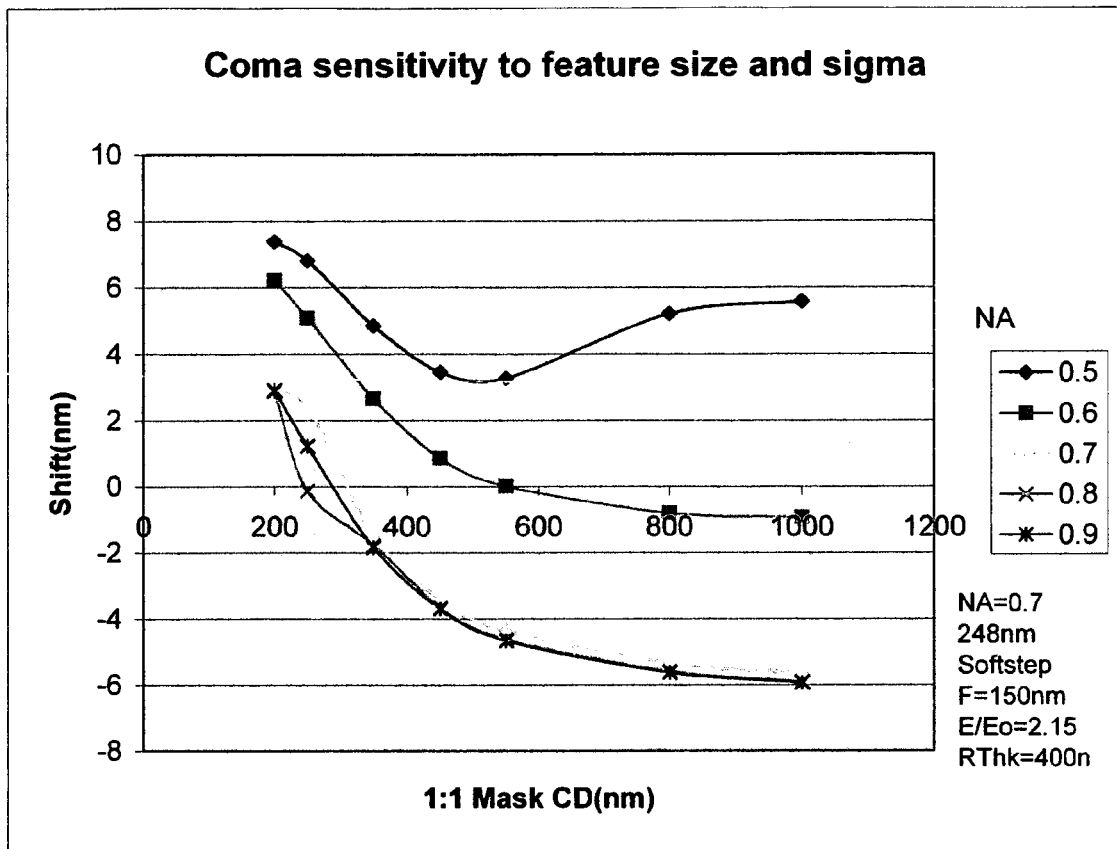
FIG. 12 is a chart that illustrates simulations of coma shift for equal line and space structures.

Heretofore our explicit examples of zero-coma conditions have been directed towards large (~1 um) printed features. These will typically be utilized for frame-in-frame type alignment attributes (FIG. 2a) utilized by current overlay tools. However, grating type alignment attributes (FIG. 2a, bottom) or wafer alignment marks (FIG. 2a) can be utilized by some overlay tools or wafer stepper alignment systems. See "Overlay Alignment Measurement of Wafers", N. Bareket, U.S. Pat. No. 6,079,256 issued Jun. 27, 2000, FIG. 1b; "Method of Measuring Bias and Edge Overlay Error for Sub 0.5 Micron Ground Rules", C. Ausschnitt et al., U.S. Pat. No. 5,757,507 issued May 26, 1998, FIG. 20. To the extent these alignment attributes are not large isolated features, the specific zero coma illumination conditions for large features will not apply. However, by applying the method of the present invention (FIG. 7a), it is possible to determine the zero coma illumination conditions by taking into account the specific geometry of the alignment attributes utilized in measuring the lens transverse distortion (DX, DY). Thus, simulations of coma shift for equal line and space structures are shown in FIG. 12. In FIG. 12, an NA=0.7 exit pupil with 248 nm illumination is simulated at a variety of line/space widths (X-axis) and conventional source numerical apertures (different curves). Our previous simulations correspond to large (~1000 nm) features on this plot. Since zero coma illuminating conditions occur even for small (~250 nm L/S) features and also at intermediate (~550 nm L/S) feature sizes, we conclude that over a wide range of practical L/S sizes, zero coma conditions are present and can be utilized in the practice of the invention.

Figure 14:
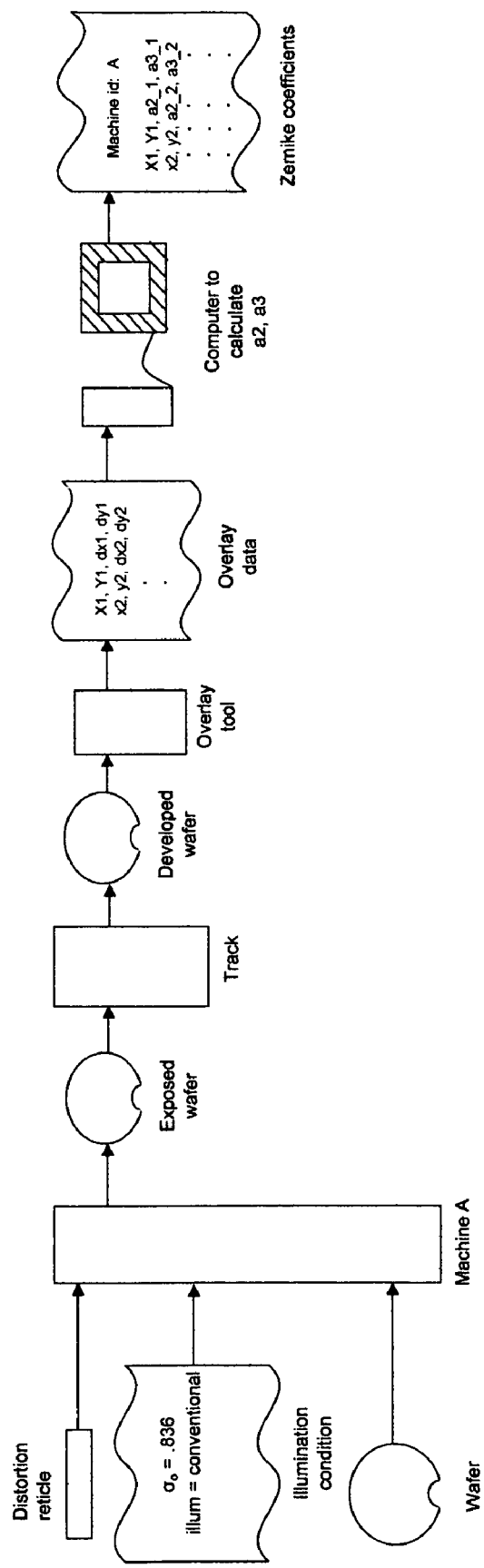
FIG. 14 is a diagram of a process for determining a2, a3 values in a lithographic projection imaging tool in accordance with the present invention.

Heretofore, we have been concerned with the measurement of transverse distortion that is divorced from lens coma shift. That is, determination of a2 and a3 without knowing the Zernike coma values. The method of this invention could also be applied to measuring machines either during their manufacture or after being placed in a semiconductor fab and utilizing the results to correct or adjust the machine. FIG. 14 shows the application of the method of this invention to determine lithographic tilt (a2, a3) in a projection machine.

FIG. 14 shows separate, distributed components including a lithographic projection machine (Machine A), development track, overlay tool, and computer as they might be deployed in a chip fabrication system or at the machine manufacturer. The computer to calculate a2 and a3 can be a separate computer, such as a desktop computer, or can be integrated with other system machinery, such as Machine A to control the projection imaging process.

Figure 15:
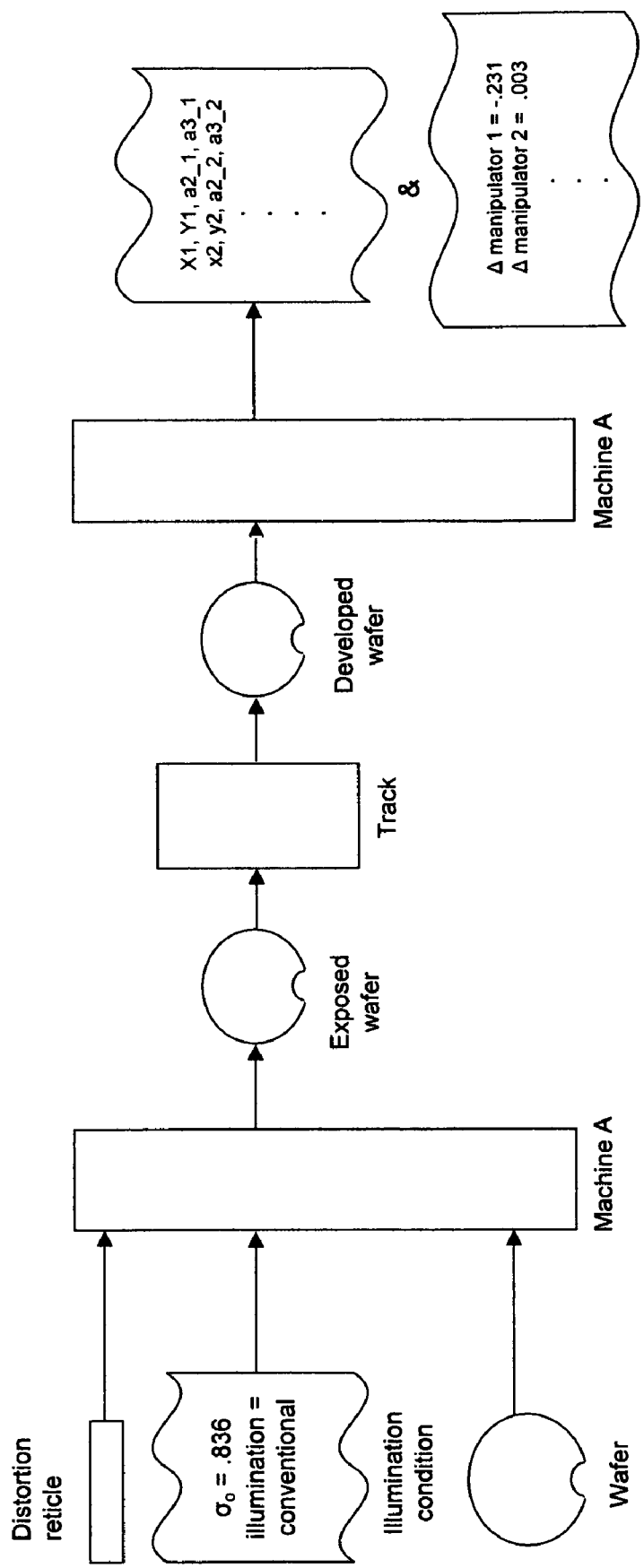
FIG. 15 is a diagram of a process for determining transverse distortion and making corrections in a lithographic image projection system constructed in accordance with the present invention

FIG. 15 shows the application of the techniques of the present invention to machine self-determination of lithographic tilt. FIG. 15 shows that Machine A utilizes a distortion reticle at one of the zero coma illumination conditions determined in accordance with the invention to create an exposed wafer that is sent out to the development track (attached to the projection machine in a chip fab, or hand carried at a machine manufacturer) for resist development, and then placed back on Machine A (indicated by the second illustration of Machine A in FIG. 15). The machine then reads the completed alignment attributes (e.g. see FIG. 2a, typically frame-in-frame or wafer alignment marks) and literally generates the overlay data (represented by x1, y1, dx1, dy1; x2, y2, dx2, dy2; . . . in FIG. 15) with an overlay tool. After processing to get the lens distortion (dx, dy) values, the Zernike tilt coefficients (a2, a3) are determined by a computer using Equation 5. The resulting (a2, a3) values can then be used to compute any machine adjustments required to bring the machine closer to its desired performance state. The machine adjustments are represented by the "manipulator 1" and "manipulator 2" output values shown in FIG. 15, indicating adjustments to the operation of the Machine A and projection imaging system, such as focus adjustments or table adjustments.

In the case of their use during machine manufacture, the techniques according to the invention aid in delivering the lowest native distortion to the end user (such as a chip fab). In the case of a chip fab, ongoing periodic use of the techniques described herein will characterize the actual state of distortion of lenses on the fab floor and will be useful in routing and matching exposure layers performed on different machines and in determining precisely when a machine has gone far enough out of adjustment to warrant a field readjustment.

Figure 16:
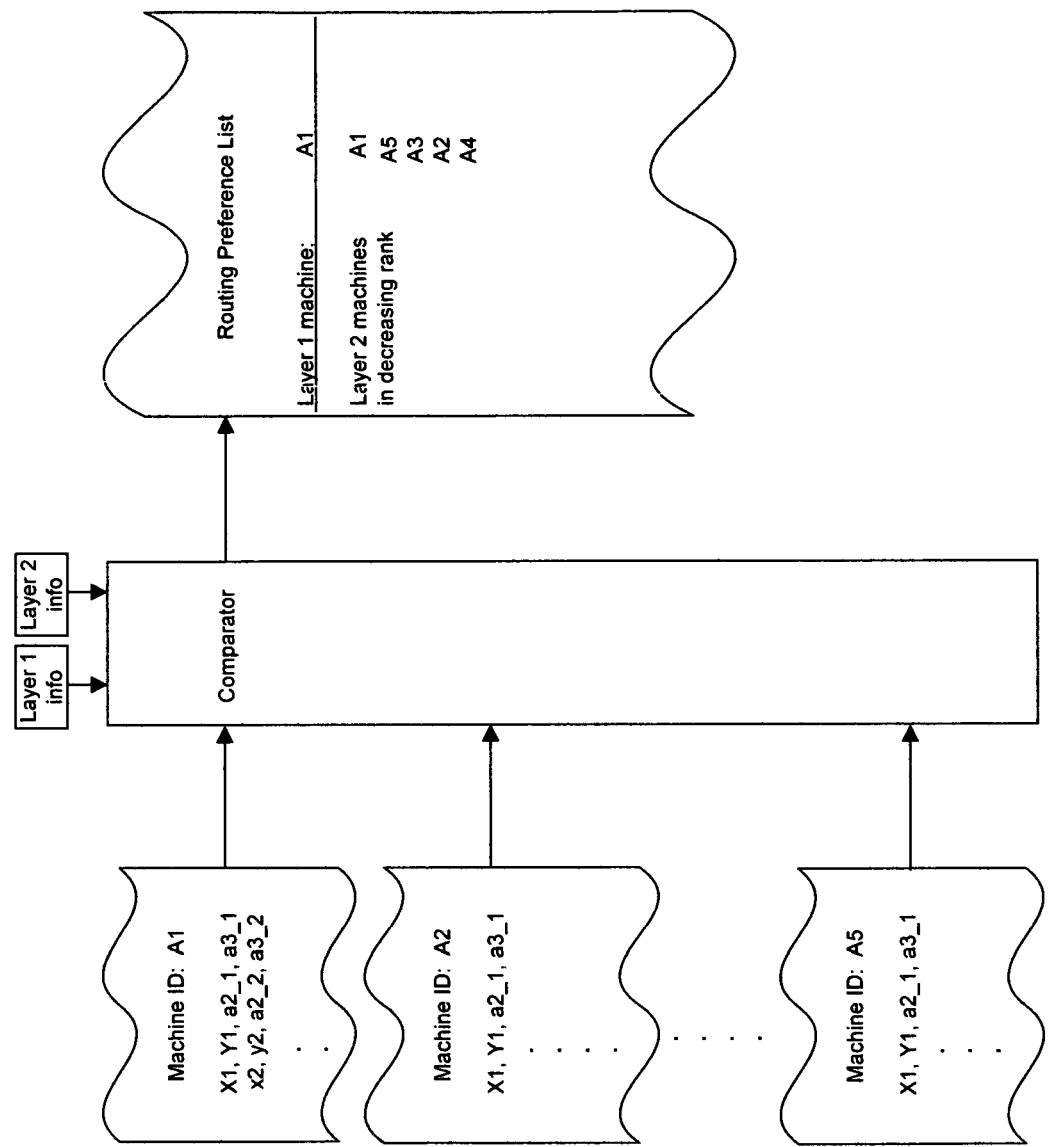
FIG. 16 is a diagram of a process of operating a system for chip fabrication in accordance with the present invention.

FIG. 16 shows the application of processing in accordance with the invention to routing product in a chip fabrication manufacturing system (chip fab). For purposes of illustration, five machines are indicated in connection with FIG. 16, represented by Machine A1, Machine A2, . .

., Machine A5. Zernike distortion data collected in accordance with the methods described above for the five machines shown is provided to a comparator shown in FIG. 16. The comparator can be implemented as a software operation or application that is executed on the imaging projection system machine. That is, the imaging projection system machine can include a computer that controls operations of the system and that implements the comparator functionality. The computer can comprise a desktop computer, workstation, or processor and associated apparatus that is integrated into the system and can provide the comparator functionality. After the comparator receives the Zernike distortion data, the comparator creates a routing preference list. The routing preference list shows which machines are best suited to work with other machines, as far as minimizing lens induced distortion is concerned. Thus, from the exemplary FIG. 16 output of the comparator when Machine Al prints Layer 1, it should be apparent that, in decreasing order of preference, Layer 2 should be printed on Machines A1, A5, A3, A2, A4. Each of the other machines will have a corresponding routing preference list. The routing preference lists, generated in accordance with Zernike distortion data collected in accordance with the methods described above, will be used by the chip fab to control routing of materials and manufacturing of circuit chips during processing, as will be known to those skilled in the art in view of the description above.

While the present invention has been described in conjunction with specific preferred embodiments, many alternatives, modifications, and variations will be apparent to those skilled in the art in light of the foregoing description. It is therefore contemplated that the appended claims will embrace any such alternatives, modifications and variations as falling within the true scope and spirit of the present invention.

We claim:

1. A process for providing illumination conditions for accurate determination of Zernike tilt coefficients in the presence of third-order coma for a lithographic projection system, the process comprising:

selecting an optimized illumination condition;

performing a lens distortion test method using an optimized illumination condition selected from the determined illumination conditions;

constructing a lens distortion map in accordance with the collected illumination conditions and calculating Zernike tilt terms a2 and a3 in accordance with the lens distortion map such that the calculated Zernike tilt terms correspond to calculations in the absence of the effects of third-order coma for field positions of interest.

2. A process as defined in claim 1, wherein selecting an optimized illumination condition comprises:

simulating a feature-shift in a scanning system of the lithographic projection imaging system in accordance with input parameters of interest and a range of illumination conditions;

determining illumination conditions within the range that significantly reduce large feature shifts that are due to third-order coma; and collecting the determined illumination conditions to enable the accurate determination of Zernike tilt coefficients.

3. A process as defined in claim 2, wherein the input parameters include an identifier for source geometry, an exit pupil geometry, a large feature of interest, an indicator of lithography processing conditions, and lens aberration for third-order x-coma and y-coma.

4. A process as described in claim 3, wherein the lithography processing conditions include conditions comprising one or more of wavelength, resist index of refraction, thickness, diffusion, focus settings, exposure settings, and NA of the exit pupil.

5. A process as defined in claim 2, wherein the determined illumination conditions include source sigma settings and geometry.

6. A process as defined in claim 2, wherein the determined illumination conditions include source NA settings and geometry.

7. A process as defined in claim 2, wherein the determined illumination conditions include source intensity distribution data and geometry.

8. A process as defined in claim 1, wherein selecting an optimized illumination condition comprises simulating a feature-shift as a function of illumination conditions for features of interest.

9. A process as defined in claim 1, wherein selecting an optimized illumination condition comprises retrieving data from a data look-up table.

10. A process as described in claim 9, wherein the look-up table includes indexing parameters comprising illumination conditions that eliminate feature shift due to third-order coma.

11. A process as described in claim 9, wherein the look-up table includes indexing parameters comprising coma induced feature-shift or coma sensitivity as a function of illumination conditions.

12. A process as described in claim 9, wherein the look-up table includes indexing parameters comprising a data relationship of optimized illumination conditions according to the numerical aperture and wavelength of the imaging system.

13. A process as described in claim 9, wherein the look-up table includes records populated through simulation using known aberration data.

14. A process as defined in claim 9, wherein the determined illumination conditions include source sigma settings and geometry.

15. A process as defined in claim 9, wherein the determined illumination conditions include source NA settings and geometry.

16. A process as defined in claim 9, wherein the determined illumination conditions include source intensity distribution data and geometry.

17. A process for operating a lithographic projection imaging system, the process comprising:

simulating a feature-shift in a scanning system of the lithographic projection imaging system in accordance with input parameters of interest and a range of illumination conditions;

determining illumination conditions within the range that significantly reduce large feature shifts that are due to third-order coma;

collecting the determined illumination conditions to enable the accurate determination of Zernike tilt coefficients;

performing a lens distortion test method using an optimized illumination condition selected from the determined illumination conditions;

constructing a lens distortion map in accordance with the collected illumination conditions and calculating Zernike tilt terms a2 and a3 in accordance with the lens distortion map such that the calculated Zernike tilt terms correspond to calculations in the absence of the effects of third-order coma for field positions of interest.

18. A process as defined in claim 17, wherein the input parameters include an identifier for source geometry, an exit pupil geometry, a large feature of interest, an indicator of lithography processing conditions, and lens aberration for third-order x-coma and y-coma.

19. A process as defined in claim 17, wherein the determined illumination conditions include source sigma settings and geometry.

20. A process as defined in claim 17, wherein the determined illumination conditions include source NA settings and geometry.

21. A process as defined in claim 17, wherein the determined illumination conditions include source intensity distribution data and geometry.

22. A projection lithography tool comprising:
an illumination source;
a scanning system; and
a scanning system controller;
wherein a projection lens of the scanning system is adjusted by the scanning system controller in accordance with Zernike tilt coefficients determined by the controller after performing operations comprising:
selecting an optimized illumination condition;
performing a lens distortion test method using an optimized illumination condition selected from the determined illumination conditions;
constructing a lens distortion map in accordance with the collected illumination conditions and calculating Zernike tilt terms a2 and a3 in accordance with the lens distortion map such that the calculated Zernike tilt terms correspond to calculations in the absence of the effects of third-order coma for field positions of interest.

23. A projection lithography tool as defined in claim 22, wherein the controller selects an optimized illumination condition by performing operations comprising:
simulating a feature-shift in a scanning system of the lithographic projection imaging system in accordance with input parameters of interest and a range of illumination conditions;
determining illumination conditions within the range that significantly reduce large feature shifts that are due to third-order coma; and
collecting the determined illumination conditions to enable the accurate determination of Zernike tilt coefficients.

24. A projection lithography tool as defined in claim 23, wherein the input parameters include an identifier for source geometry, an exit pupil geometry, a large feature of interest, an indicator of lithography processing conditions, and lens aberration for third-order x-coma and y-coma.

25. A projection lithography tool as described in claim 24, wherein the lithography processing conditions include conditions comprising one or more of wavelength, resist index of refraction, thickness, diffusion, focus settings, exposure settings, and NA of the exit pupil.

26. A projection lithography tool as defined in claim 23, wherein the determined illumination conditions include source sigma settings and geometry.

27. A projection lithography tool as defined in claim 23, wherein the determined illumination conditions include source NA settings and geometry.

28. A projection lithography tool as defined in claim 23, wherein the determined illumination conditions include source intensity distribution data and geometry.

29. A projection lithography tool as defined in claim 22, wherein selecting an optimized illumination condition comprises simulating a feature-shift as a function of illumination conditions for features of interest.

30. A projection lithography tool as defined in claim 22, wherein selecting an optimized illumination condition comprises retrieving data from a data look-up table.

31. A projection lithography tool as described in claim 30, wherein the look-up table includes indexing parameters comprising illumination conditions that eliminate feature shift due to third-order coma.

32. A projection lithography tool as described in claim 30, wherein the look-up table includes indexing parameters comprising coma induced feature-shift or coma sensitivity as a function of illumination conditions.

33. A projection lithography tool as described in claim 30, wherein the look-up table includes indexing parameters comprising a data relationship of optimized illumination conditions according to the numerical aperture and wavelength of the imaging system.

34. A projection lithography tool as described in claim 30, wherein the look-up table includes records populated through simulation using known aberration data.

35. A projection lithography tool as described in claim 30, wherein the determined illumination conditions include source sigma settings and geometry.

36. A projection lithography tool as described in claim 30, wherein the determined illumination conditions include source NA settings and geometry.

37. A projection lithography tool as described in claim 30, wherein the determined illumination conditions include source intensity distribution data and geometry.

38. A process for chip fabrication with a photolithographic projection imaging system, the process comprising:
determining illumination conditions of the projection imaging system for accurate determination of Zernike tilt coefficients in the presence of third-order coma for a lithographic projection system by performing operations comprising
selecting an optimized illumination condition,
performing a lens distortion test method using an optimized illumination condition selected from the determined illumination conditions, and
constructing a lens distortion map in accordance with the collected illumination conditions and calculating Zernike tilt terms a2 and a3 in accordance with the lens distortion map such that the calculated Zernike tilt terms correspond to calculations in the absence of the effects of third-order coma for field positions of interest;
controlling lithographic imaging in the system in accordance with the determined Zernike tilt coefficients; and
operating a chip producing process in accordance with the controlled lithographic imaging.

39. A process as defined in claim 38, wherein selecting an optimized illumination condition comprises:
simulating a feature-shift in a scanning system of the lithographic projection imaging system in accordance with input parameters of interest and a range of illumination conditions;
determining illumination conditions within the range that significantly reduce large feature shifts that are due to third-order coma; and collecting the determined illumination conditions to enable the accurate determination of Zernike tilt coefficients.

40. A process as defined in claim 39, wherein the input parameters include an identifier for source geometry, an exit pupil geometry, a large feature of interest, an indicator of lithography processing conditions, and lens aberration for third-order x-coma and y-coma.

41. A process as described in claim 40, wherein the lithography processing conditions include conditions comprising one or more of wavelength, resist index of refraction, thickness, diffusion, focus settings, exposure settings, and NA of the exit pupil.

42. A process as defined in claim 39, wherein the determined illumination conditions include source sigma settings and geometry.

43. A process as defined in claim 39, wherein the determined illumination conditions include source NA settings and geometry.

44. A process as defined in claim 39, wherein the determined illumination conditions include source intensity distribution data and geometry.

45. A process as defined in claim 38, wherein selecting an optimized illumination condition comprises simulating a feature-shift as a function of illumination conditions for features of interest.

46. A process as defined in claim 38, wherein selecting an optimized illumination condition comprises retrieving data from a data look-up table.

47. A process as defined in claim 46, wherein the look-up table includes indexing parameters comprising illumination conditions that eliminate feature shift due to third-order coma.

48. A process as described in claim 46, wherein the look-up table includes indexing parameters comprising coma induced feature-shift or coma sensitivity as a function of illumination conditions.

49. A process as described in claim 46, wherein the look-up table includes indexing parameters comprising a data relationship of optimized illumination conditions according to the numerical aperture and wavelength of the imaging system.

50. A process as described in claim 46, wherein the look-up table includes records populated through simulation using known aberration data.

51. A process as defined in claim 46, wherein the determined illumination conditions include source sigma settings and geometry.

52. A process as defined in claim 46, wherein the determined illumination conditions include source NA settings and geometry.

53. A process as defined in claim 46, wherein the determined illumination conditions include source intensity distribution data and geometry.

* * * * *